US007920408B2

(12) United States Patent
Azuma et al.

(10) Patent No.: US 7,920,408 B2
(45) Date of Patent: Apr. 5, 2011

(54) RESISTANCE CHANGE NONVOLATILE MEMORY DEVICE

(75) Inventors: Ryotaro Azuma, Osaka (JP); Kazuhiko Shimakawa, Osaka (JP); Satoru Fujii, Osaka (JP); Yoshihiko Kanzawa, Osaka (JP)

(73) Assignee: Panasonic Corporation, Osaka (JP)

( * ) Notice: Subject to any disclaimer, the term of this patent is extended or adjusted under 35 U.S.C. 154(b) by 70 days.

(21) Appl. No.: 12/513,914

(22) PCT Filed: Jun. 20, 2008

(86) PCT No.: PCT/JP2008/001603
§ 371 (c)(1),
(2), (4) Date: May 7, 2009

(87) PCT Pub. No.: WO2009/001534
PCT Pub. Date: Dec. 31, 2008

(65) Prior Publication Data
US 2010/0046273 A1     Feb. 25, 2010

(30) Foreign Application Priority Data

Jun. 22, 2007 (JP) .................. 2007-164545

(51) Int. Cl.
*G11C 11/00* (2006.01)
(52) U.S. Cl. ............. 365/148; 365/51; 365/230.03; 365/230.04; 365/46; 365/63
(58) Field of Classification Search .......... 365/148, 365/51, 230.03, 230.04, 46, 63, 185.05
See application file for complete search history.

(56) References Cited

U.S. PATENT DOCUMENTS

| 6,917,532 | B2 * | 7/2005 | Van Brocklin et al. ......... 365/51 |
| 7,233,024 | B2 * | 6/2007 | Scheuerlein et al. ........... 257/74 |
| 2005/0057993 | A1 * | 3/2005 | Ueda et al. ................... 365/222 |
| 2005/0230724 | A1 | 10/2005 | Hsu |

(Continued)

FOREIGN PATENT DOCUMENTS

JP      2004-031948      1/2004

(Continued)

OTHER PUBLICATIONS

Baek, I.G., et al., "Multi-layer Cross-point Binary Oxide Resistive Memory (OxRRAM) for Post-NAND Storage Application", IEEE International Electron Devices Meeting, Dec. 2005, pp. 769-772, Session 31.

*Primary Examiner* — Connie C Yoha
(74) *Attorney, Agent, or Firm* — McDermott Will & Emery LLP

(57) ABSTRACT

Memory cells (MC) are formed at intersections of bit lines (BL) extending in the X direction and word lines (WL) extending in the Y direction. A plurality of basic array planes sharing the word lines (WL), each formed for a group of bit lines (BL) aligned in the Z direction, are arranged side by side in the Y direction. In each basic array plane, bit lines in even layers and bit lines in odd layers are individually connected in common. Each of selection switch elements (101 to 104) controls switching of electrical connection/non-connection between the common-connected even layer bit line and a global bit line (GBL), and each of selection switch elements (111 to 114) control switching of connection/non-connection between the common-connected odd layer bit line and the global bit line (GBL).

15 Claims, 18 Drawing Sheets

U.S. PATENT DOCUMENTS

| | | |
|---|---|---|
| 2005/0243595 A1 | 11/2005 | Rinerson et al. |
| 2006/0203541 A1 | 9/2006 | Toda |
| 2006/0268594 A1 | 11/2006 | Toda |
| 2007/0132049 A1 | 6/2007 | Stipe |

FOREIGN PATENT DOCUMENTS

| | | |
|---|---|---|
| JP | 2006-203098 | 8/2006 |
| WO | WO 2005/117021 A1 | 12/2005 |

\* cited by examiner

FIG. 1
(a) Bidirectional memory cell
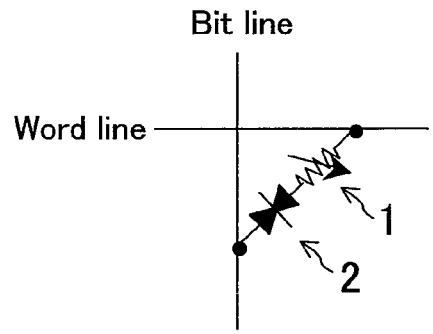
(b) Unidirectional memory cell
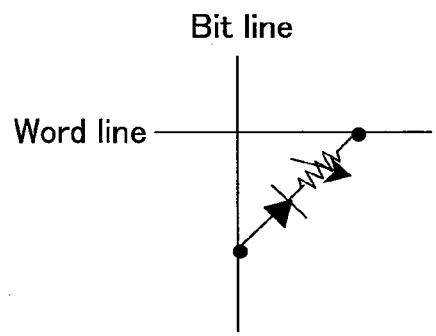
(c) Diode-less memory cell
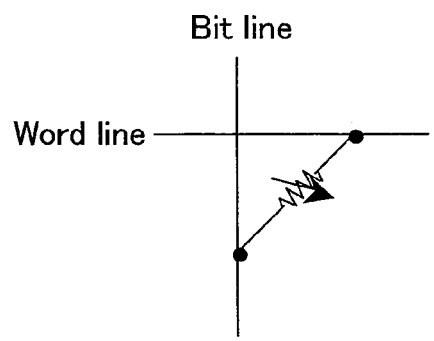

FIG. 2
(a)
Single-layer cross point memory cell
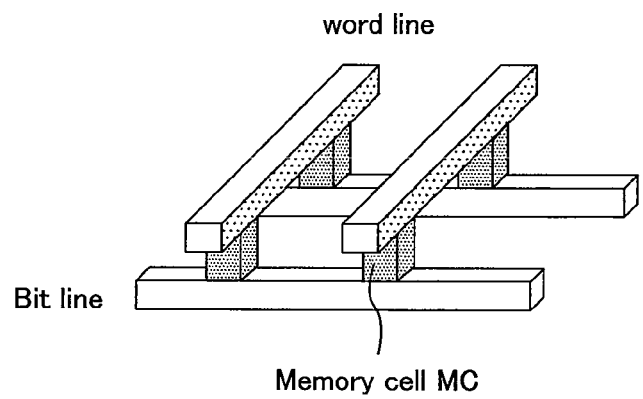
(b)
Multilayer cross point memory cell
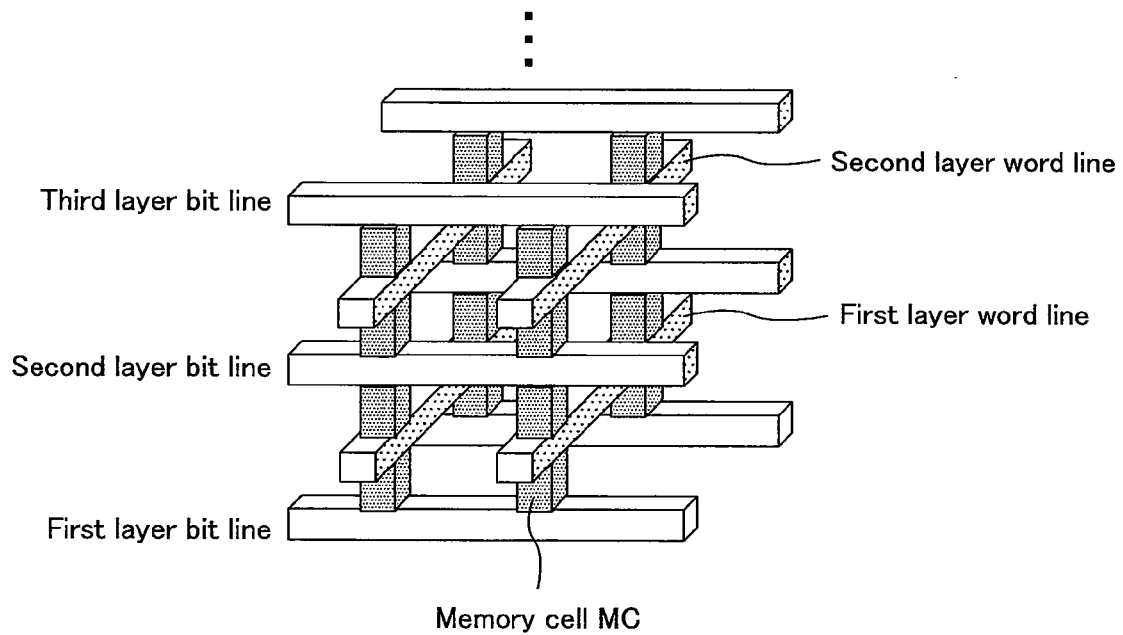

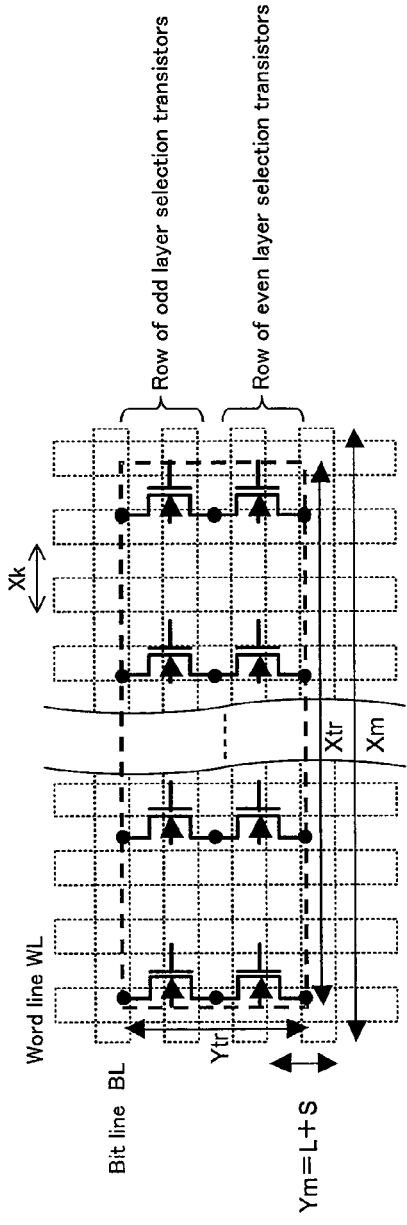
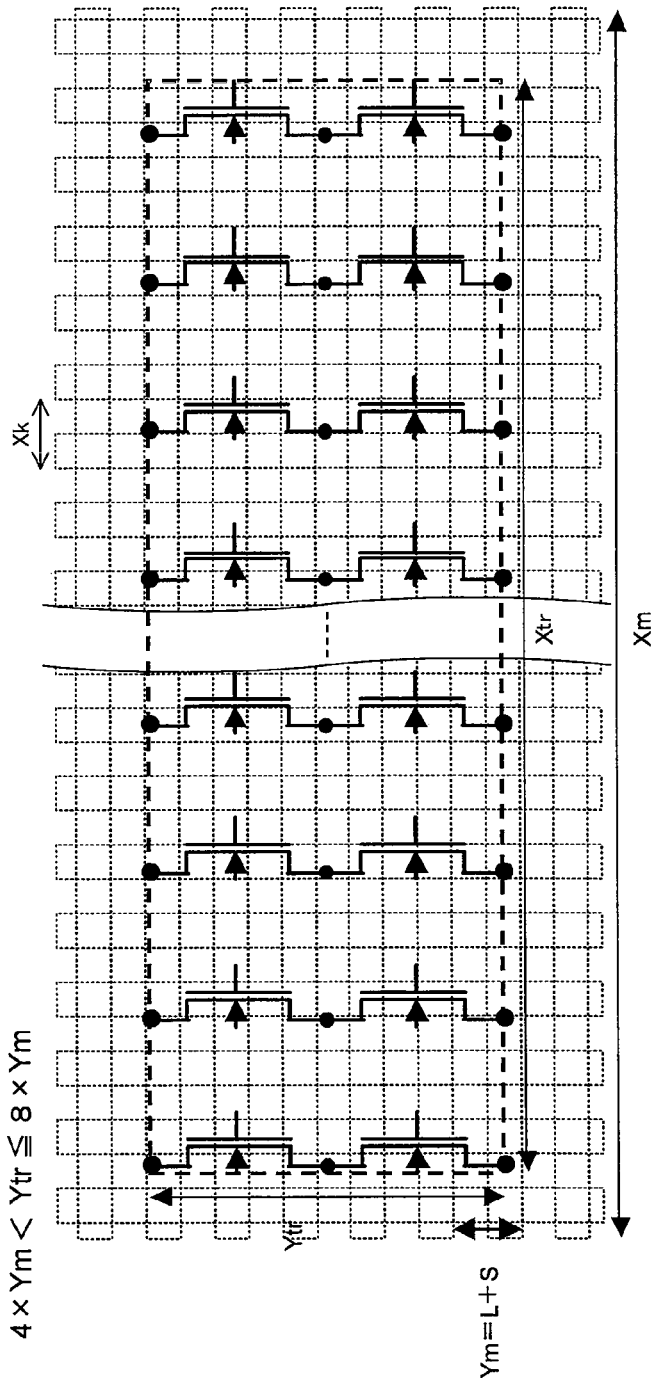
FIG. 16

I-V characteristic of 4k × 4k bit memory array

I-V characteristic of 32 × 4k bit memory array

RESISTANCE CHANGE NONVOLATILE MEMORY DEVICE

RELATED APPLICATIONS

This application is the U.S. National Phase under 35 U.S.C. §371 of International Application No. PCT/JP2008/001603, filed on Jun. 20, 2008, which in turn claims the benefit of Japanese Application No. 2007-164545, filed on Jun. 22, 2007, the disclosures of which Applications are incorporated by reference herein.

TECHNICAL FIELD

The present invention relates to a nonvolatile memory device having memory cells each including a so-called variable resistance element.

BACKGROUND ART

In recent years, research and development of nonvolatile memory devices having memory cells each including a variable resistance element has been in progress. The variable resistance element refers to an element that has a nature of changing its resistance value according to an electrical signal and can store information depending on the change in resistance value.

For implementing memory cells each including a variable resistance element, a so-called cross point structure may be adopted as an example. In the cross point structure, memory cells are formed at intersections of bit lines and word lines placed orthogonal to each other so as to be sandwiched between the bit lines and the word lines.

Patent Document 1 describes a nonvolatile memory device using variable resistors having bidirectionality as memory cells. In this document, disclosed is use of a varistor, for example, as a bidirectional nonlinear element for a diode of a memory cell for the purpose of reducing the leak current flowing in a non-selected cell. The cross point structure is also disclosed.

Patent Document 2 describes a nonvolatile memory device provided with a three-dimensional cross-point variable-resistance memory array having a multilayer structure.

Non-Patent Document 1 discloses a memory cell structure in which a variable resistance film and a unidirectional diode are combined. A multilayer structure is also disclosed.

Patent Document 3 discloses a nonvolatile memory having a three-dimensional structure that includes memory cells each having a polycrystalline silicon diode and a unipolar rewritable variable-resistance memory element (RRAM).

Patent Document 4 discloses a multilayer memory structure having memory cells each composed of a bipolar rewritable variable-resistance memory element and a zener diode.

Patent Document 5 discloses a multilayer memory structure having memory cells each composed of a memory element and a unidirectional control element.

Patent Document 1: Japanese Laid-Open Patent Publication No. 2006-203098 (FIGS. 2 and 5)
Patent Document 2: Japanese Laid-Open Patent Publication No. 2005-311322 (FIG. 4)
Patent Document 3: Japanese Laid-Open Patent Publication No. 2007-165873
Patent Document 4: Japanese National Phase PCT Laid-Open Patent Publication No. 2006-514393
Patent Document 5: Japanese Laid-Open Patent Publication No. 2004-31948

Non-Patent Document 1: I. G. Baek et al., "Multi-layer Cross-point Binary Oxide Resistive Memory (OxRRAM) for Post-NAND Storage Application," IEDM2005 (IEEE International Electron Devices Meeting 2005), 769-772, Session 31 (FIG. 7, FIG. 11), Dec. 5, 2005

DISCLOSURE OF THE INVENTION

Problem to be Solved by the Invention

There are two mutually contradictory requirements on design of a memory cell array: a requirement that the array unit should be as large as possible and a requirement that the array unit should be as small as possible. In other words, for reduction of the chip area, the array unit is desirably as large as possible to reduce the area of peripheral circuits. On the contrary, for reduction of the leak current of non-selected memory cells, the array unit is preferably as small as possible. A small array unit also permits speedup, low power consumption, efficient redundancy repair and the like.

In the cross point structure, reduction in the leak current of non-selected memory cells is a critical problem to be overcome in read operation and write operation. In particular, in the case of a bidirectional variable resistance element which resistance changes with bidirectional voltage application, such as application of a positive voltage to put the element in a high resistance state and application of a negative voltage to put the element in a low resistance stage, it is unavailable to adopt an active leak current reduction method using application of a reverse bias, which is normally adopted for unidirectional variable resistance elements. Hence, the leak current amount will be determined depending on the ON/OFF characteristic of a bidirectional diode in a specific operating bias condition, and based on this, the array size will be inevitably determined. Judging from the currently-expected diode characteristics, the array size must be considerably small, and thus the memory cell array must be multi-segmented. However, simply multi-segmenting a memory cell array will lead to extensive increase in layout area, which is therefore disadvantageous.

In view of the above problem, an object of the present invention is to provide a nonvolatile memory device using variable resistance elements that has a structure in which the array size is small enough to permit sufficient reduction in the leak current of non-selected memory cells and yet the layout area does not increase.

Means for Solving the Problems

According to the present invention, in a nonvolatile memory device using variable resistance elements, a multilayer cross point structure and a hierarchical bit line scheme are adopted, and yet increase in layout area that may occur due to existence of selection switch elements for implementing the hierarchical bit line scheme is suppressed.

Specifically, the resistance change nonvolatile memory device of the present invention, including memory cells each having a variable resistance element whose resistance value reversibly changes according to an electrical signal, includes: a substrate; and a memory cell array formed on the substrate, the memory cell array including the plurality of memory cells arranged in an array, wherein in the memory cell array, the memory cells are formed at intersections of bit lines formed in a plurality of layers to extend in X direction and word lines formed in layers between the bit lines to extend in Y direction so as to be sandwiched between the bit lines and the word lines, a plurality of basic array planes sharing the word lines, each formed for each group of bit lines aligned in Z direction in which layers are stacked, are arranged side by side in the Y direction, and in each of the basic array planes, bit lines in even layers are connected in common, and bit lines in odd layers are connected in common, and wherein the resistance change nonvolatile memory device further includes: global bit lines; and first and second selection switch elements provided for each basic array plane, the first selection switch element controls switching of electrical connection/non-connection between the global bit line for the relevant basic array plane and common-connected even layer bit lines in the relevant basic array plane according to an even layer selection signal, and the second selection switch element controls switching of electrical connection/non-connection between the global bit line for the relevant basic array plane and common-connected odd layer bit lines in the relevant basic array plane according to an odd layer selection signal.

According to the present invention, memory cells are formed at intersections of bit lines formed in a plurality of layers to extend in the X direction and word lines formed in layers between the bit lines to extend in the Y direction. A plurality of basic array planes sharing the word lines (WL), each formed for a group of bit lines (BL) aligned in the Z direction, are arranged side by side in the Y direction. In other words, a so-called multilayer cross point structure is implemented. In each basic array plane, bit lines in even layers and bit lines in odd layers are individually connected in common. A first selection switch element controls switching of electrical connection/non-connection between the common-connected even layer bit line and a global bit line, and a second selection switch element controls switching of connection/non-connection between the common-connected odd layer bit line and the global bit line. In other words, in each basic array plane, the hierarchical bit line scheme is implemented with two selection switch elements. With this configuration, the array size can be reduced without causing increase in layout area as far as possible, and thus the leak current of non-selected memory cells can be sufficiently reduced.

Effect of the Invention

According to the present invention, a resistance change nonvolatile memory device having a multi-segmented memory cell array can be implemented with a small layout area.

BRIEF DESCRIPTION OF THE DRAWINGS

FIG. 1(a) is a circuit diagram of a memory cell in an embodiment of the present invention, FIG. 1(b) is a circuit diagram of a unidirectional memory cell, and FIG. 1(c) is a circuit diagram of a diode-less memory cell.

FIG. 2(a) is a view showing a single-layer cross point structure, and FIG. 2(b) is a view showing a multilayer cross point structure

FIG. 11 shows a physical structure of the memory cell array in the embodiment of the present invention, in which FIG. 1(a) is a plan view and FIG. 1(b) is a cross-sectional view.

FIG. 16 shows views for demonstrating a placement method for selection switch elements.

DESCRIPTION OF REFERENCE NUMERALS

Figure 3:
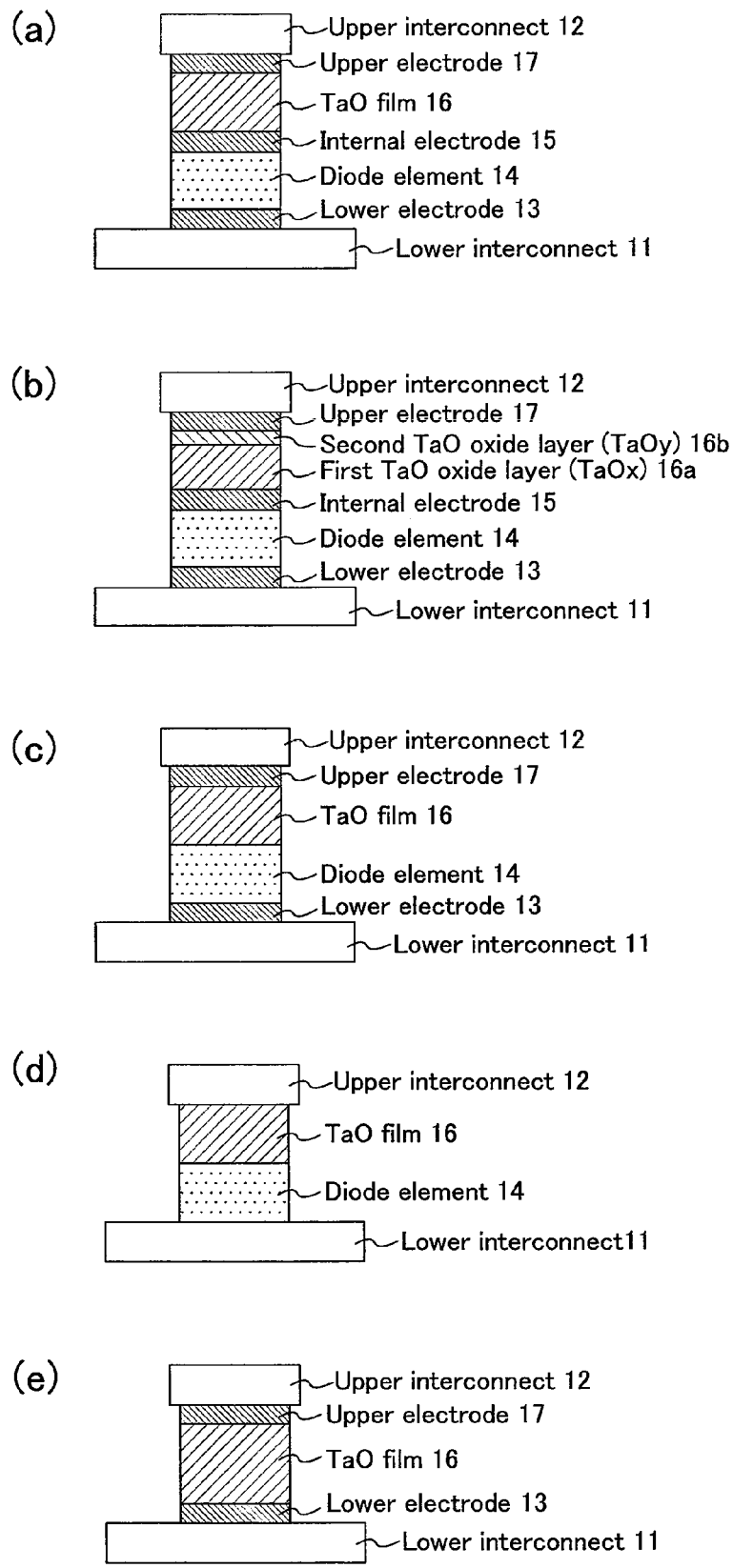
FIGS. 3(a) to 3(d) show examples of the cross-sectional structure of the memory cell in the embodiment of the present invention.
FIG. 3(e) shows an example of the cross-sectional structure of the diode-less memory cell of FIG. 1(c).

MC Memory cell
BL Bit line
WL Word line
GBL Global bit line
BL_e0 to BL_e3 Common-connected even layer bit lines
BL_o0 to BL_o3 Common-connected odd layer bit lines
BLs_e0 Even layer selection signal
BLs_o0 Odd layer selection signal
1 Variable resistance element
2 Diode element
3 Substrate
100 Memory cell array
101 to 104 First selection switch elements
111 to 114 Second selection switch elements

BEST MODE FOR CARRYING OUT THE INVENTION

Hereinafter, an embodiment of the present invention will be described in detail with reference to the relevant drawings.

FIG. 1(a) is a circuit diagram of the memory cell (cross point memory cell) in this embodiment. As shown in FIG. 1(a), use of a bidirectional memory cell is a premise in this embodiment. The bidirectional memory cell includes a variable resistance element 1 whose resistance changes bidirectionally and a bidirectional diode element 2 connected in series with the variable resistance element 1. The variable resistance element 1, which can be in a low resistance state and in a high resistance state, can store information with a reversible change in resistance value according to an electrical signal. In other words, the variable resistance element has bidirectionality: that is, the variable resistance element in the low resistance state changes to the high resistance state when the applied voltage exceeds a predetermined first voltage, and the variable resistance element in the high resistance state changes to the low resistance state when the applied voltage in a direction opposite to the first voltage application direction exceeds a predetermined second voltage. The bidirectional diode element 2 has a nonlinear current characteristic with respect to the applied voltage and also has bidirectionality in which the current flows bidirectionally.

Figure 19:
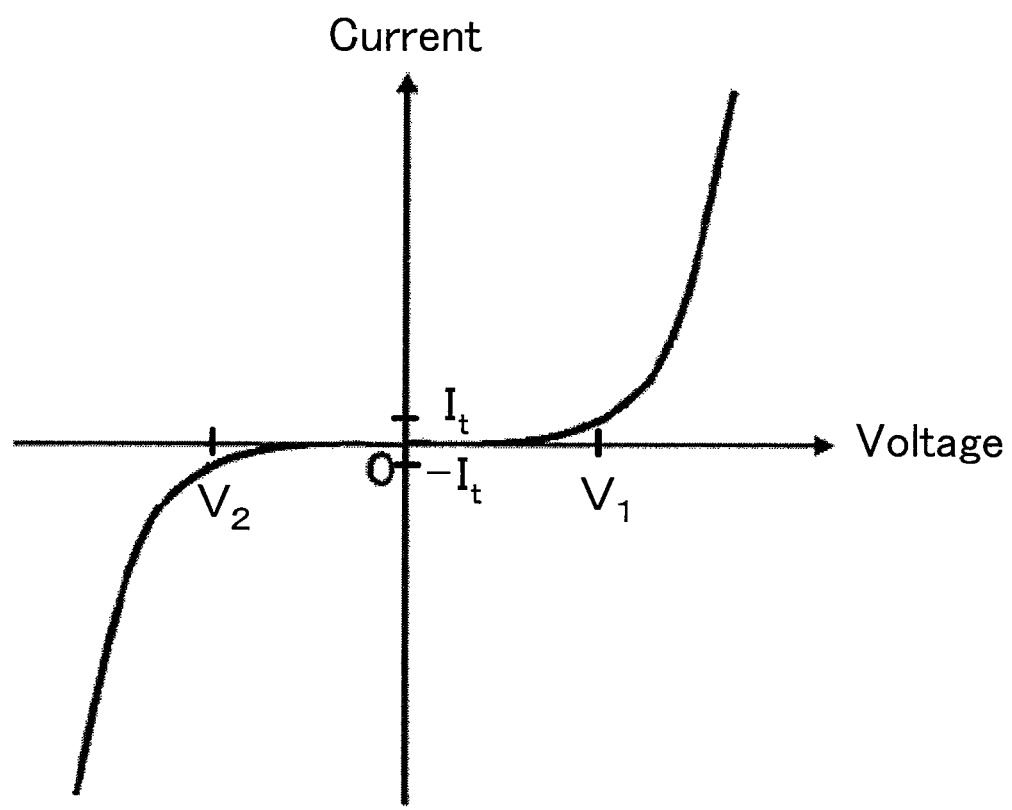
FIG. 19 is a graph showing an example of the voltage-current characteristic of a bidirectional diode element.

FIG. 19 shows an example of the voltage-current characteristic of a bidirectional diode element. In FIG. 19, It (>0) denotes a predetermined current for determining a threshold voltage, V1 denotes a first threshold voltage and V2 denotes a second threshold voltage. As shown in FIG. 19, this characteristic is nonlinear having a range of the voltage V satisfying V2<V<V1 in which the resistance is so large that no current substantially flows. In this case, −It<I<It. On the contrary, in a range of the voltage V satisfying V≦V2 or V1≦V, the resistance value abruptly decreases allowing a large current flow. In this case, It≦I in the range satisfying V1≦V, and I≦−It in the range satisfying V≦V2.

The threshold voltage as used herein is a voltage at which a predetermined current flows. The predetermined current as used herein is a value that can be determined arbitrarily for determination of the threshold voltage, which is determined depending on the characteristics of an element controlled by the diode and the characteristics of the diode. In general, the threshold current is determined as a current at the time of change from a state in which substantially no current flows to a state in which a large current flows.

Note that although the magnitude of the current during positive-voltage application and that during negative-voltage application are represented as symmetric with respect to the origin in FIG. 19, these are not necessarily symmetric. For example, |V1|<|V2| or |V2|<|V1| may be satisfied.

A memory element of one bit is implemented with a bidirectional memory cell placed between a bit line and a word line.

Note that the configuration of the present invention may also adopt a unidirectional memory cell as shown in FIG. 1(*b*) and a diode-less memory cell composed of only a variable resistance element as shown in FIG. 1(*c*).

FIG. 2 shows conceptual views of three-dimensional structures including memory cells. FIG. 2(*a*) shows a three-dimensional structure of so-called single-layer cross point memory cells, in which memory cells MC are placed at intersections of bit lines and word lines extending orthogonal to each other so as to be sandwiched between the bit lines and the word lines. FIG. 2(*b*) shows a three-dimensional structure of so-called multilayer cross point memory cells, in which the single-layer cross point memory cells in FIG. 2(*a*) are stacked one upon another.

FIG. 3(*a*) shows an example of the cross-sectional structure of the memory cell in this embodiment. Referring to FIG. 3(*a*), one of a lower interconnect 11 and an upper interconnect 12 is a bit line and the other is a word line. Between the lower interconnect 11 and the upper interconnect 12, formed sequentially are a lower electrode 13, a diode element 14 (corresponding to the bidirectional diode element 2), an internal electrode 15, a TaO film 16 (corresponding to the variable resistance element 1) and an upper electrode 17. In the TaO film 16, the tantalum oxide represented by $TaO_x$ is at least required to satisfy 0<x<2.5. In particular, the $TaO_x$ film in this embodiment should desirably satisfy 0.8≦x≦1.9.

FIG. 3(*b*) shows another example of the cross-sectional structure of the memory cell in this embodiment, in which the TaO film has a two-layer structure. In other words, in place of the TaO film 16, a first TaO oxide layer ($TaO_x$) 16*a* and a second TaO oxide layer ($TaO_y$) 16*b* are formed, where 0<x<2.5 and x<y should preferably be satisfied. More preferably, the second TaO oxide layer ($TaO_y$) 16*b* is in contact with the upper electrode 17 and has a thickness of 1 nm to 8 nm, and 0.8≦x≦1.9 and 2.1≦y≦2.5 are satisfied.

FIGS. 3(*c*) and 3(*d*) show other examples of the cross-sectional structure of the memory cell in this embodiment. In FIG. 3(*c*), the internal electrode 15 is omitted. In FIG. 3(*d*), the lower electrode 13 and the upper electrode 17 are further omitted, and the lower interconnect 11 and the upper interconnect 12 also serve as the lower electrode and the upper electrode, respectively. FIG. 3(*e*) shows an example of the cross-sectional structure of the diode-less memory cell of FIG. 1(*c*). Note that in FIGS. 3(*c*), 3(*d*) and 3(*e*), also, the TaO film 16 may have a two-layer structure like in FIG. 3(*b*). Although the variable resistance element is placed above the diode element in FIG. 3, the diode element may be placed above the variable resistance element.

Figure 4:
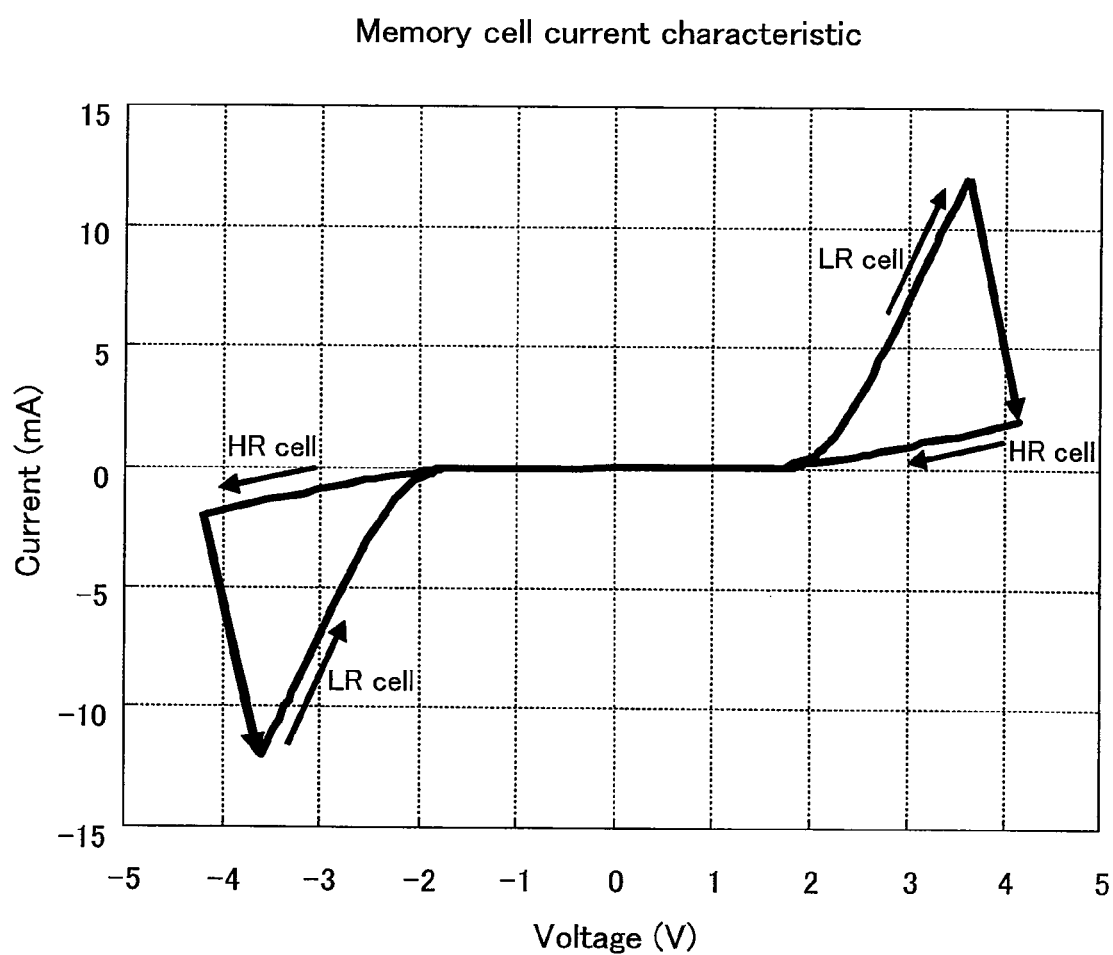
FIG. 4 is a graph showing the current-voltage relationship of the memory cell in the embodiment of the present invention.

FIG. 4 is a graph showing the current-voltage relationship of the memory cell in this embodiment. The graph of FIG. 4 corresponds to the circuit diagram of FIG. 1(*a*). In FIG. 4, the x-axis represents the voltage applied between the bit line and the word line, and the y-axis represents the current flowing in the memory cell. The "LR cell" represents that the memory cell is in a low resistance state, and the "HR cell" represents that the memory cell is in a high resistance state. As shown in FIG. 4, assuming that the memory cell is currently in the low resistance state (LR cell), the current greatly increases when the voltage rises exceeds about "2 V." When the voltage further rises to as high as near "4 V," the resistance value of the memory cell changes putting the memory cell in the high resistance state (HR cell), and this greatly reduces the current. On the contrary, when the voltage drops to as low as below about "−4 V," the resistance value of the memory cell changes putting the memory cell in the low resistance state (LR cell), and this greatly increases the current. In this way, the resistance change occurs bidirectionally.

Figure 5:
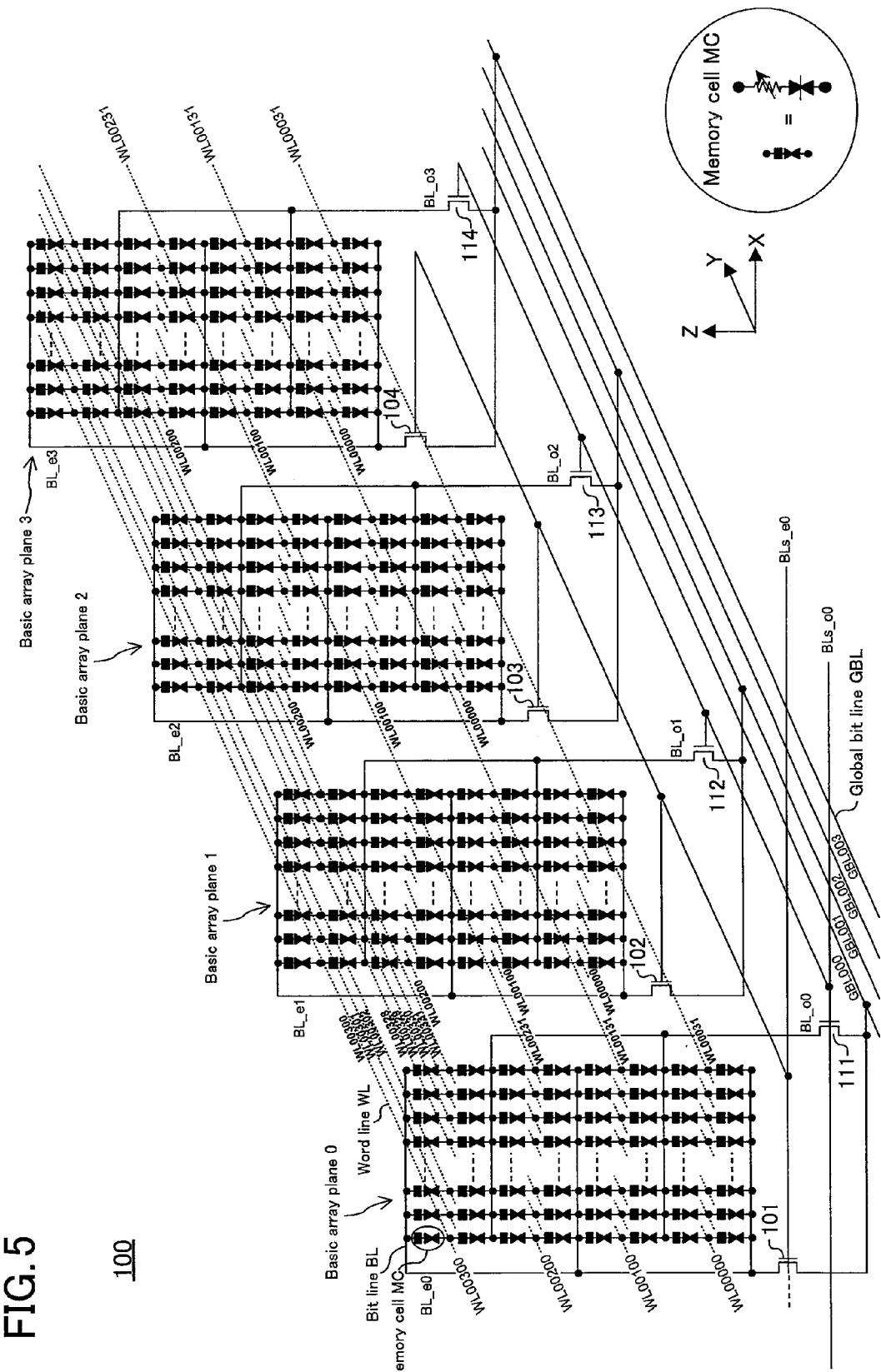
FIG. 5 is a circuit diagram showing a configuration of a memory cell array in the embodiment of the present invention.

FIG. 5 is a circuit diagram showing a configuration of a memory cell array of a resistance change nonvolatile memory device of this embodiment. In FIG. 5, the direction in which bit lines extend refers to the X direction, the direction in which word lines extend refers to the Y direction, and the direction in which layers for bit lines and word lines are stacked one on another refers to the Z direction.

In FIG. 5, bit lines BL extending in the X direction are formed in a plurality of layers (five layers in FIG. 5), and word lines WL extending in the Y direction are formed in layers (four layers in FIG. 5) located between the bit lines. In a memory cell array 100, memory cells MC are formed at intersections of the bit lines BL and the word lines WL so as to be sandwiched between the bit lines BL and the word lines WL. Note that illustration of the memory cells MC and the word lines is partly omitted for simplification of the drawing.

For each group of bit lines BL in the different layers aligned in the Z direction, each of basic array planes 0 to 3 is constructed of memory cells MC formed between the bit lines BL and the word lines WL. The word lines WL are shared among the basic array planes 0 to 3. In the example of FIG. 5, each of the basic array planes 0 to 3 is composed of 32 memory cells MC in the X direction and eight memory cells MC in the Z direction. The memory cell array 100 is composed of the four basic array planes 0 to 3 arranged in the Y direction. Note that the number of memory cells in each basic array plane and the number of basic array planes arranged in the Y direction are not limited to the above.

In the basic array planes 0 to 3, respectively, the bit lines BL in even layers are connected in common (BL_e0 to BL_e3) while the bit lines BL in odd layers are connected in common (BL_o0 to BL_o3).

Global bit lines GBL000 to GBL003 extend in the Y direction. Also, first selection switch elements 101 to 104 and second selection switch elements 111 to 114 are respectively provided for the basic array planes 0 to 3. In FIG. 5, it is assumed that the first selection switch elements 101 to 104 and the second selection switch elements 111 to 114 are each composed of an n-type MOS transistor.

The first selection switch elements 101 to 104 respectively control switching of electrical connection/non-connection between the global bit lines GBL000 to GBL003 for the corresponding basic array planes and the common-connected even layer bit lines BL_e0 to BL_e3 in the corresponding basic array planes according to an even layer selection signal BLs_e0. The second selection switch elements 111 to 114 respectively control switching of electrical connection/non-connection between the global bit lines GBL000 to GBL003 for the corresponding basic array planes and the common-connected odd layer bit lines BL_o0 to BL_o3 in the corresponding basic array planes according to an odd layer selection signal BLs_o0.

With the above configuration, the multilayer cross point structure described above is implemented. In addition, the hierarchical bit line scheme using the bit lines BL and the global bit lines GBL is implemented. Moreover, with the common connection of the bit lines BL in the even layers and the common connection of the bit lines BL in the odd layers in each of the basic array planes 0 to 3, the number of selection switch elements required for implementing the hierarchical bit line scheme can be reduced to two. Hence, a memory cell array with a small array size can be implemented without increasing the layout area.

Figure 6:
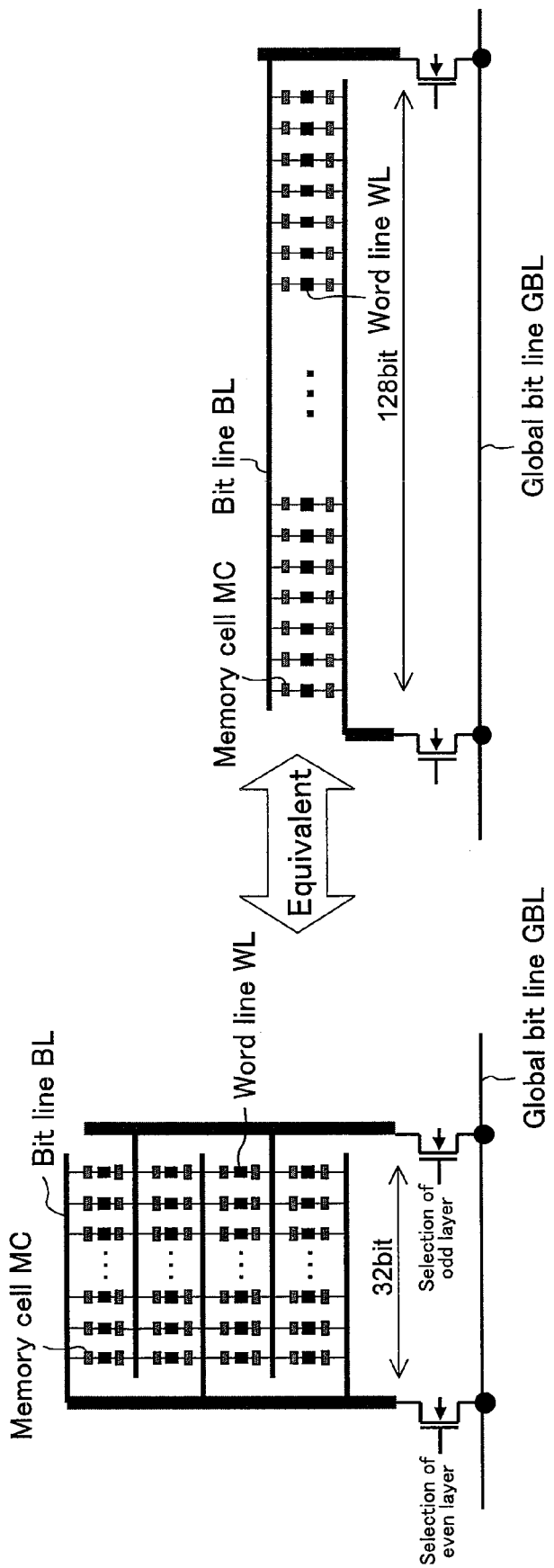
FIG. 6 is a view showing an equivalent circuit obtained by developing the basic array of FIG. 5 into a single-layer structure.

FIG. 6 is a view showing an equivalent circuit obtained by developing one basic array plane into a single-layer structure. As shown in FIG. 6, the basic array plane having eight layers of 32 memory cells MC lined in each layer is equivalent to an array having two layers of 128 memory cells MC lined in each layer. Hence, it can be understood that the bit lines BL in the even layers and the bit lines BL in the odd layers may be individually connected in common.

Figure 7:
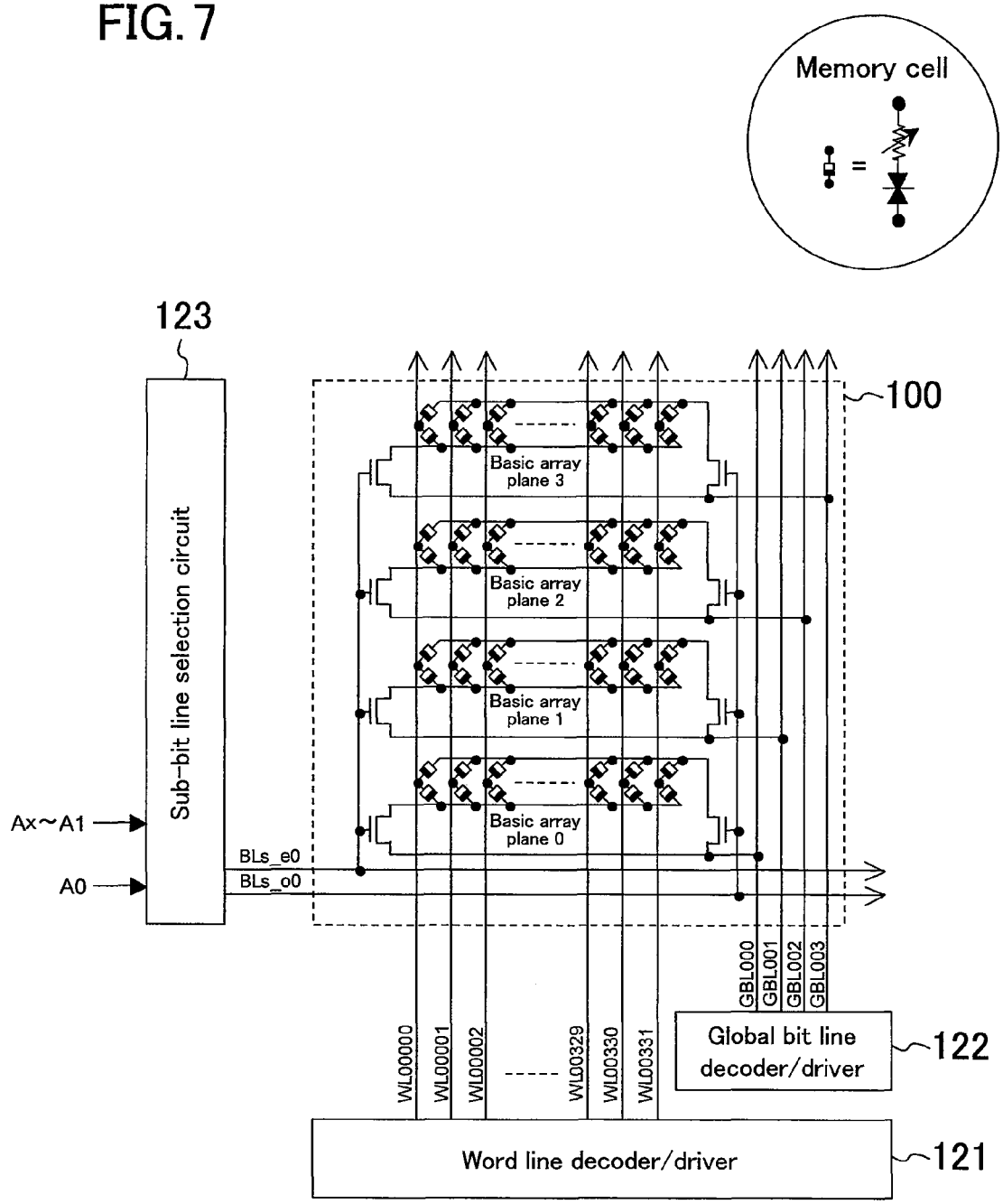
FIG. 7 is a circuit diagram showing the memory cell array of FIG. 5 and its peripheral circuits.

FIG. 7 is a circuit diagram showing the memory cell array 100 of FIG. 5 and its peripheral circuits. Referring to FIG. 7, a global bit line decoder/driver 122 drives the global bit lines GBL. A sub-bit line selection circuit 123 controls the even layer selection signal BLs_e0 and the odd layer selection signal BLs_o0 according to address signals A0 to Ax. A word line decoder/driver 121 drives the word lines WL.

Figure 8:
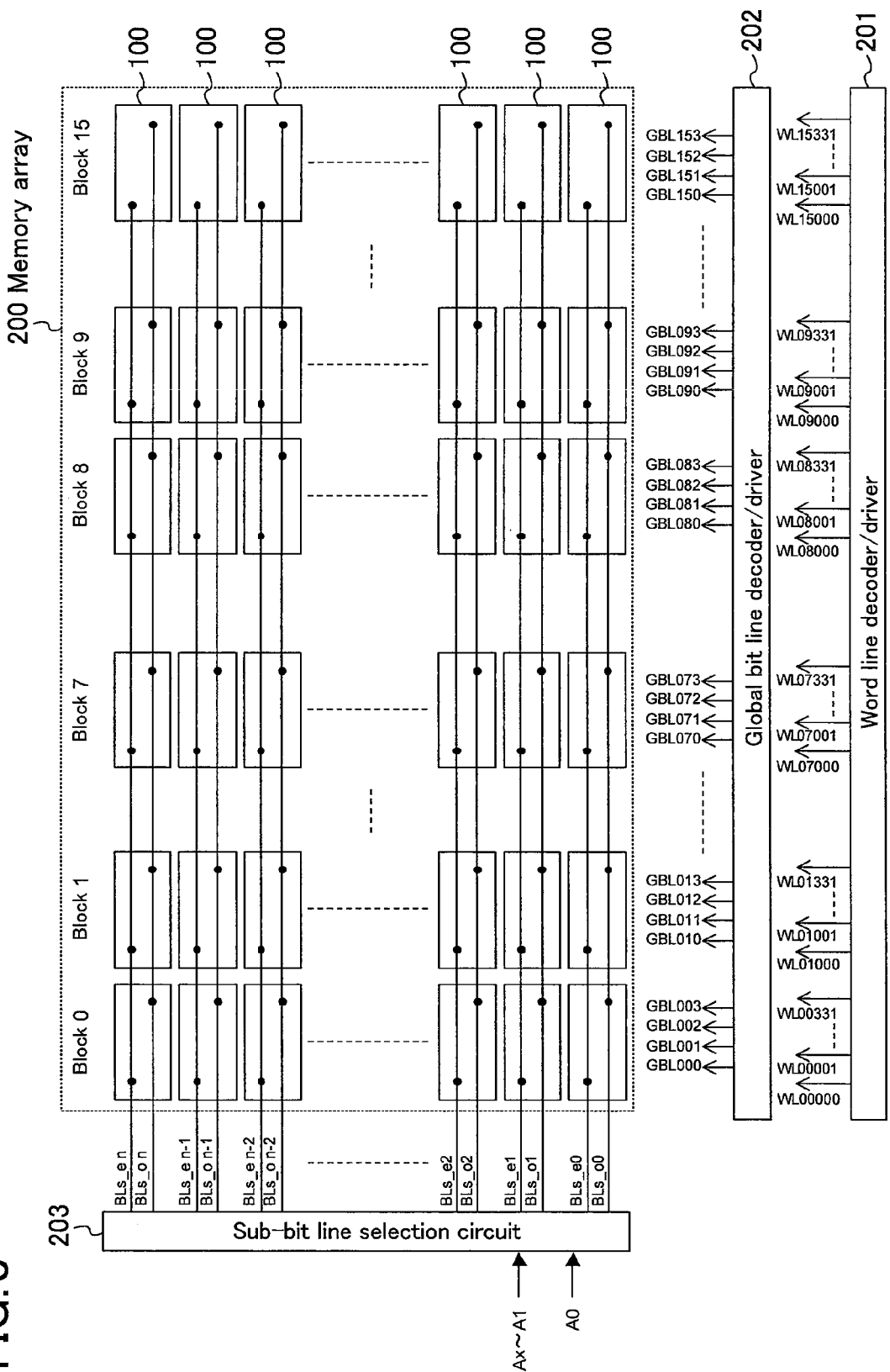
FIG. 8 is a circuit diagram showing a major portion of a resistance change nonvolatile memory device using a plurality of memory cell arrays of FIG. 5.

FIG. 8 is a circuit diagram showing a major portion of the resistance change nonvolatile memory device. As shown in FIG. 8, in an actual device, a plurality of memory cell arrays 100 of FIG. 5 are placed to constitute a memory array 200. In the example of FIG. 8, (n+1)×16 memory cell arrays 100 are placed. A word line decoder/driver 201 drives the word lines WL. A global bit line decoder/driver 202 drives the global bit lines GBL. A sub-bit line selection circuit 203 controls even layer selection signals BLs_e0 to BLs_en and odd layer selection signals BLs_o0 to BLs_on according to address signals A0 to Ax.

Figure 9:
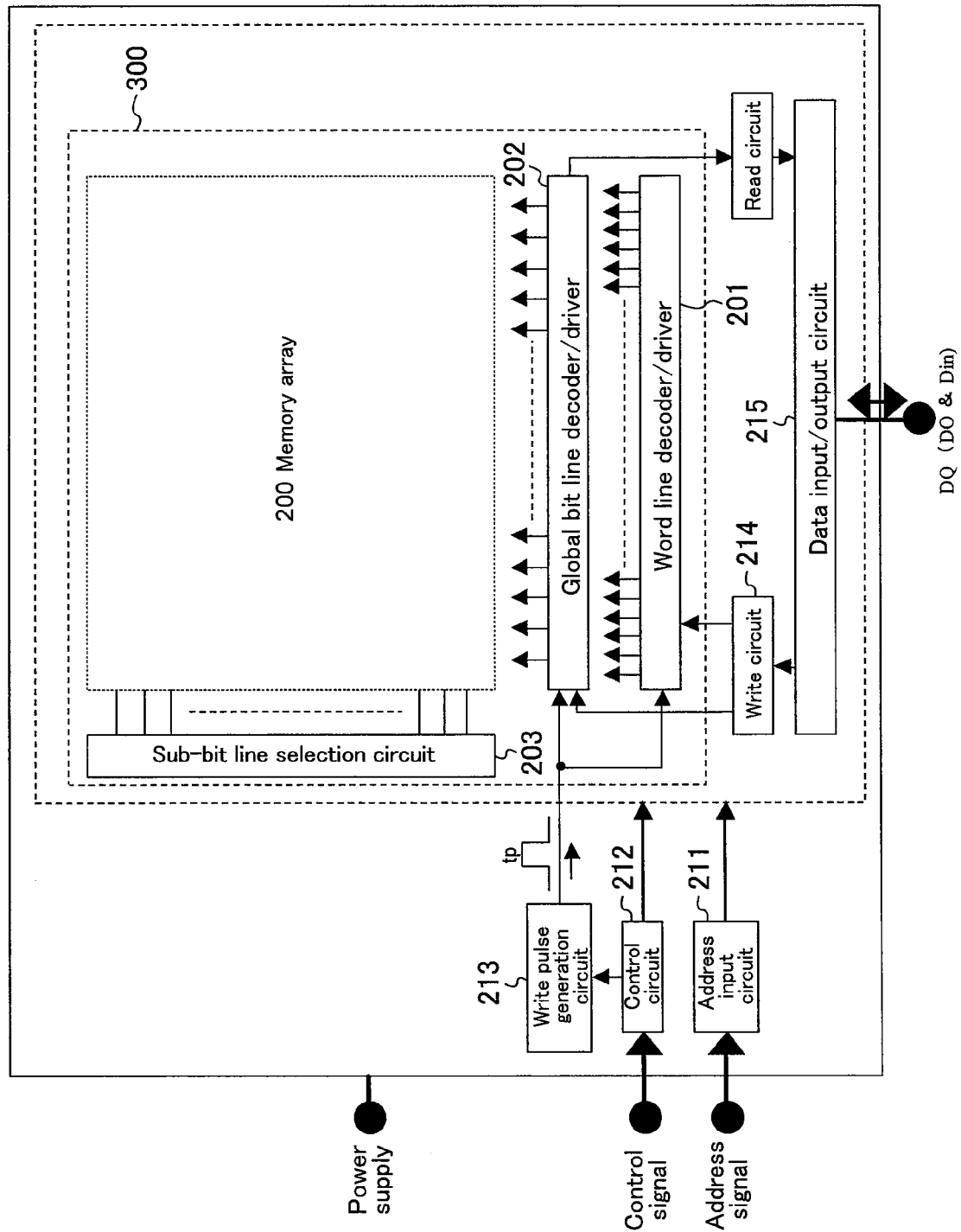
FIG. 9 is a circuit diagram showing the entire configuration of the resistance change nonvolatile memory device.

FIG. 9 is a circuit diagram showing the entire configuration of the resistance change nonvolatile memory device. In FIG. 9, a major portion 300 corresponds to the configuration of FIG. 8.

Referring to FIG. 9, an address input circuit 211 temporarily latches an address signal from outside in the erase cycle, the write cycle or the read cycle, and outputs the latched address signal to the sub-bit line selection circuit 203, the global bit line decoder/driver 202 and the word line decoder/driver 201. A control circuit 212, receiving a plurality of input signals, outputs signals representing the states in the erase cycle, the write cycle and the read cycle and during standby to the sub-bit line selection circuit 203, the global bit line decoder/driver 202, the word line decoder/driver 201, a write circuit 214 and a data input/output circuit 215 as signals appropriate to the respective circuits. The control circuit 212 also outputs an erase, write or read pulse generation trigger signal in the erase cycle, the write cycle or the read cycle to a write pulse generation circuit 213. The write pulse generation circuit 213 generates an erase, write or read time pulse in the erase cycle, the write cycle or the read cycle for an arbitrary time period (tp_E, tp_P, tp_R), and outputs the pulse to the global bit line decoder/driver 202 and the word line decoder/driver 201.

Figure 10:
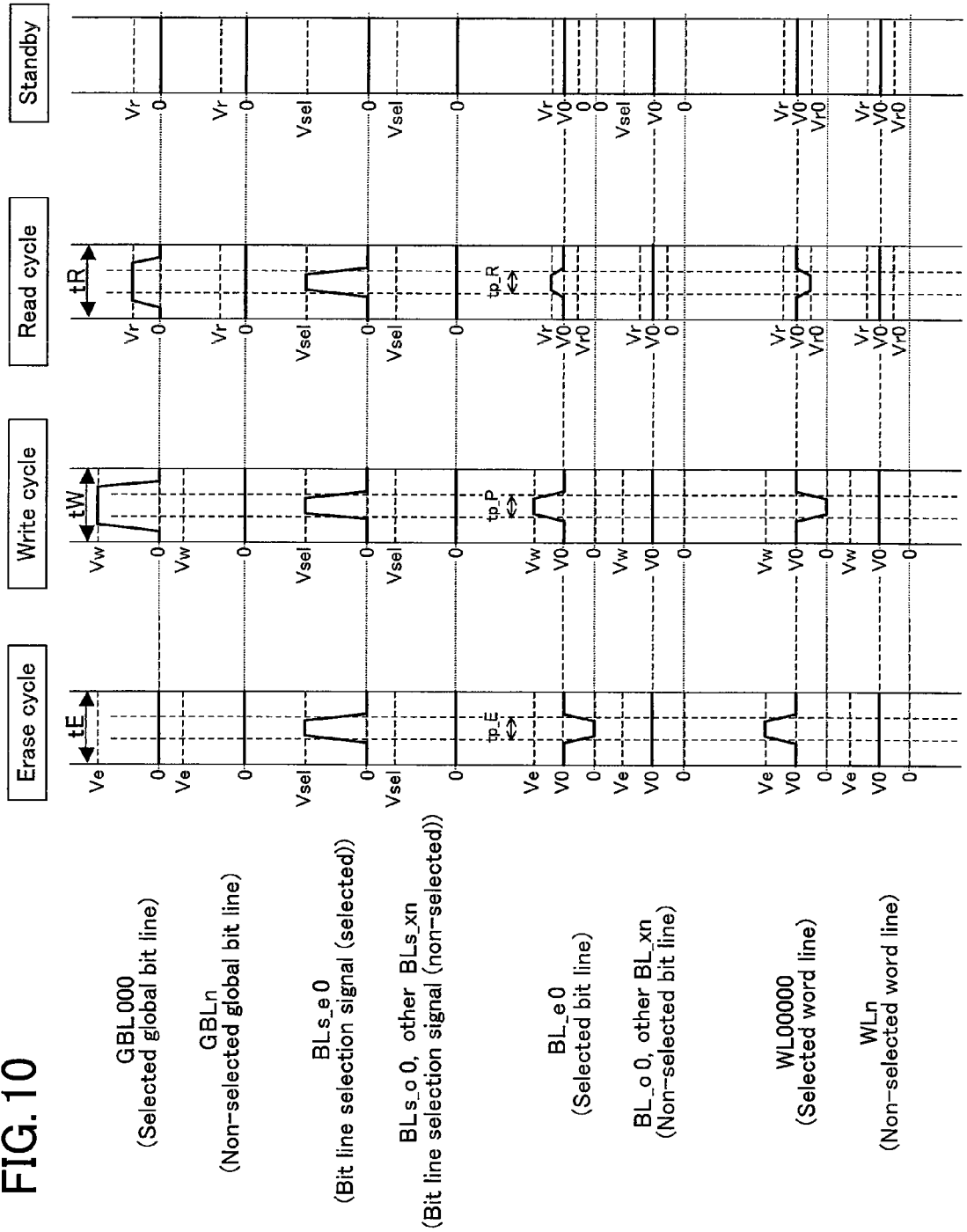
FIG. 10 is an operation timing chart of the memory cell array of FIG. 5.

FIG. 10 is an operation timing chart of the memory cell array shown in FIG. 5 and the like. As shown in FIG. 10, the operation of the memory cell array is roughly divided is into four parts: the erase cycle, the write cycle, the read cycle and standby.

First, the write cycle will be described. In the write cycle, the variable resistance element of a selected memory cell changes from the high resistance state to the low resistance state or from the low resistance state to the high resistance state. First, a write voltage Vw is applied to a selected global bit line (GBL000 in FIG. 10). The write voltage Vw is not applied to the other non-selected global bit lines. Also, a selected bit line selection signal (BLs_e0 in FIG. 10), among the bit line selection signals (even layer and odd layer selection signals), changes to a voltage Vsel. The other non-selected bit line selection signals remain unchanged.

Referring to FIG. 5, with the change of the even layer selection signal BLs_e0 to the voltage Vsel, the first selection switch elements 101 to 104, which are n-type transistors, are turned ON. With the write voltage Vw being applied to the global bit line GBL000, the voltage Vw is supplied to the common-connected even layer bit line BL_e0 in the basic array plane 0. In other words, the bit line BL_e0 is the selected bit line. The voltage Vw is not supplied to the other non-selected bit lines.

The voltage of a selected word line (WL00000 in FIG. 10) is then changed from V0 to 0 V while the other non-selected word lines are kept at voltage V0. As a result, the voltage Vw is applied to a memory cell MC sandwiched between the selected bit line BL_e0 and the selected word line WL00000, whereby the resistance value of this memory cell MC is changed.

The erase cycle is substantially the same in basic operation as the write cycle, but is different therefrom in that a voltage Ve in the reverse direction is applied to the selected memory cell MC. More specifically, the voltage of the selected global bit line GBL000 remains 0 V. Therefore, when the bit line selection signal BLs_e0 changes to the voltage Vsel, the voltage of the selected bit line BL_e0 becomes 0 V. The voltage of the selected word line WL00000 is changed from V0 to an erase voltage Ve. As a result, the voltage Ve in the reverse direction to the voltage in the write cycle is applied to the memory cell MC sandwiched between the selected bit line BL_e0 and the selected word line WL00000, whereby the resistance value of this memory cell MC is changed.

The read cycle is substantially the same in basic operation as the write cycle, but is different therefrom in that a read voltage (Vr-Vr0) smaller than the write voltage Vw is applied to the selected memory cell MC. More specifically, the voltage of the selected global bit line GBL000 changes to a voltage Vr. Therefore, when the bit line selection signal BLs_e0 changes to the voltage Vsel, the voltage of the selected bit line BL_e0 becomes Vr. The voltage of the selected word line WL00000 is changed from V0 to Vr0. As a result, the voltage (Vr-Vr0) is applied to the memory cell MC sandwiched between the selected bit line BL_e0 and the selected word line WL00000, whereby readout on whether the variable resistance element of this memory cell MC is in the high resistance state or the low resistance state can be made.

<Physical Structure of Memory Cell Array>

Figure 11:
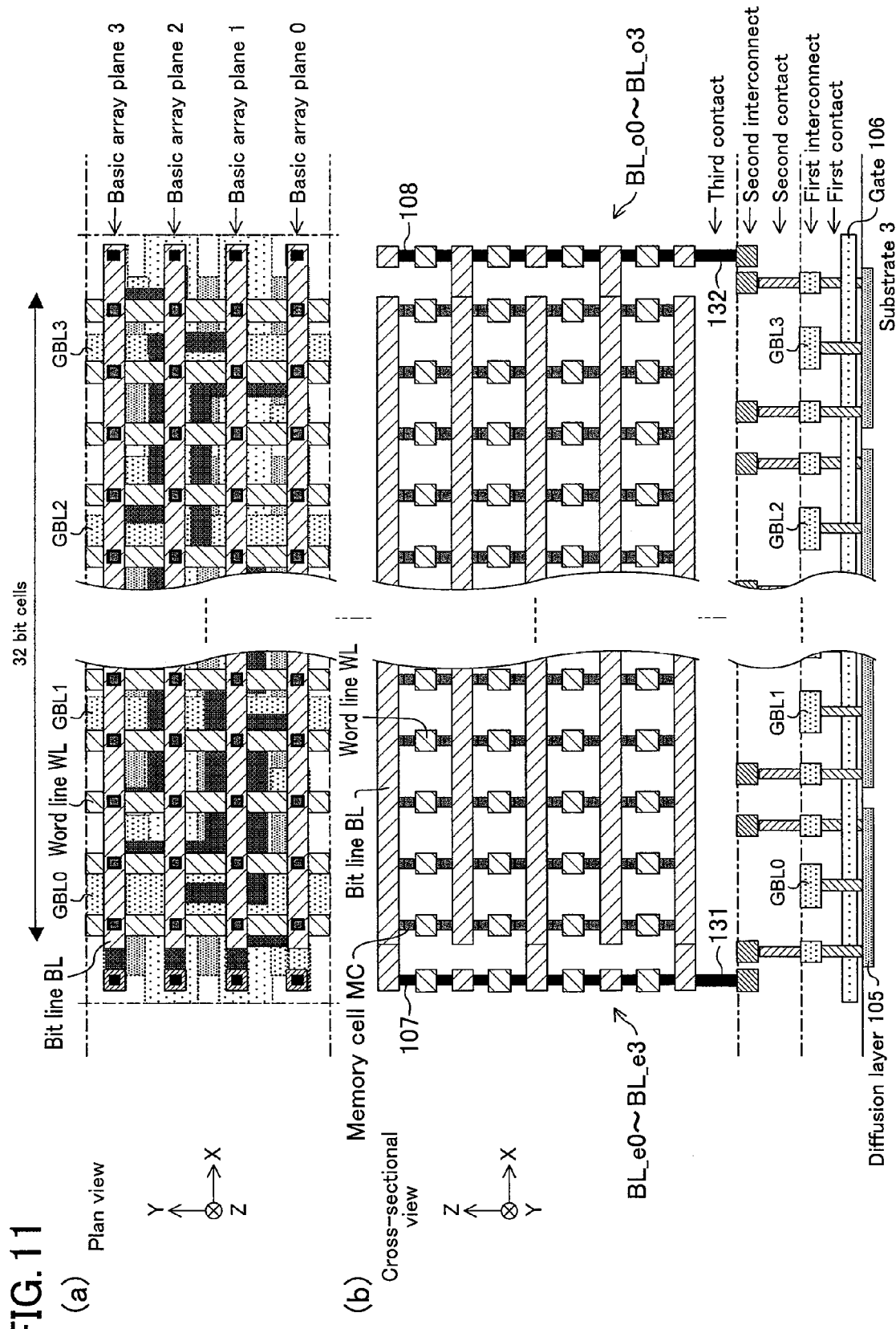

FIG. 11 is a view showing a physical structure of the memory cell array in this embodiment, in which FIG. 11(a) is a plan view and FIG. 11(b) is a cross-sectional view. In FIG. 11(a), the horizontal direction is the X direction in which the bit lines BL extend, the vertical direction is the Y direction in which the word lines WL extend, and the direction orthogonal to the plane of the figure is the Z direction. In FIG. 11(b), the horizontal direction is the X direction in which the bit lines BL extend, the vertical direction is the Z direction, and the direction orthogonal to the plane of the figure is the Y direction in which the word lines WL extend.

In the physical structure shown in FIG. 11, the memory cell array having a plurality of memory cells MC is formed on a substrate 3. Global bit lines GBL0 to GBL3 are formed extending in the Y direction in a layer (first wiring layer) located below the lower-most layer bit lines BL. The first and second selection switch elements, each made of a MOSFET, are composed of diffusion layers 105 formed in the substrate 3 and gates 106 located further below the global bit lines GBL0 to GBL3. The global bit lines GBL0 to GBL3 are connected with the diffusion layers 105 via first contacts.

In the respective basic array planes 0 to 3, the bit lines BL in the even layers are connected in common via contacts 107 provided between the word line layers and the bit line layers (BL_e0 to BL_e3). Likewise, the bit lines BL in the odd layers are connected in common via contacts 108 provided between the word line layers and the bit line layers (BL_o0 to BL_o3). The common-connected even layer bit lines BL_e0 to BL_e3 are respectively connected with second interconnects via third contacts (contacts 131), and the common-connected odd layer bit lines BL_o0 to BL_o3 are respectively connected with second interconnects via respective third contacts (contacts 132).

The diffusion layers 105 constituting the first and second selection switches are connected with the second interconnects via the first contacts, first interconnects and second contacts. And, via the second interconnects, the common-connected even layer bit lines BL_e0 to BL_e3 and the common-connected odd layer bit lines BL_o0 to BL_o3 are electrically connected with the diffusion layers 105.

Figure 12:
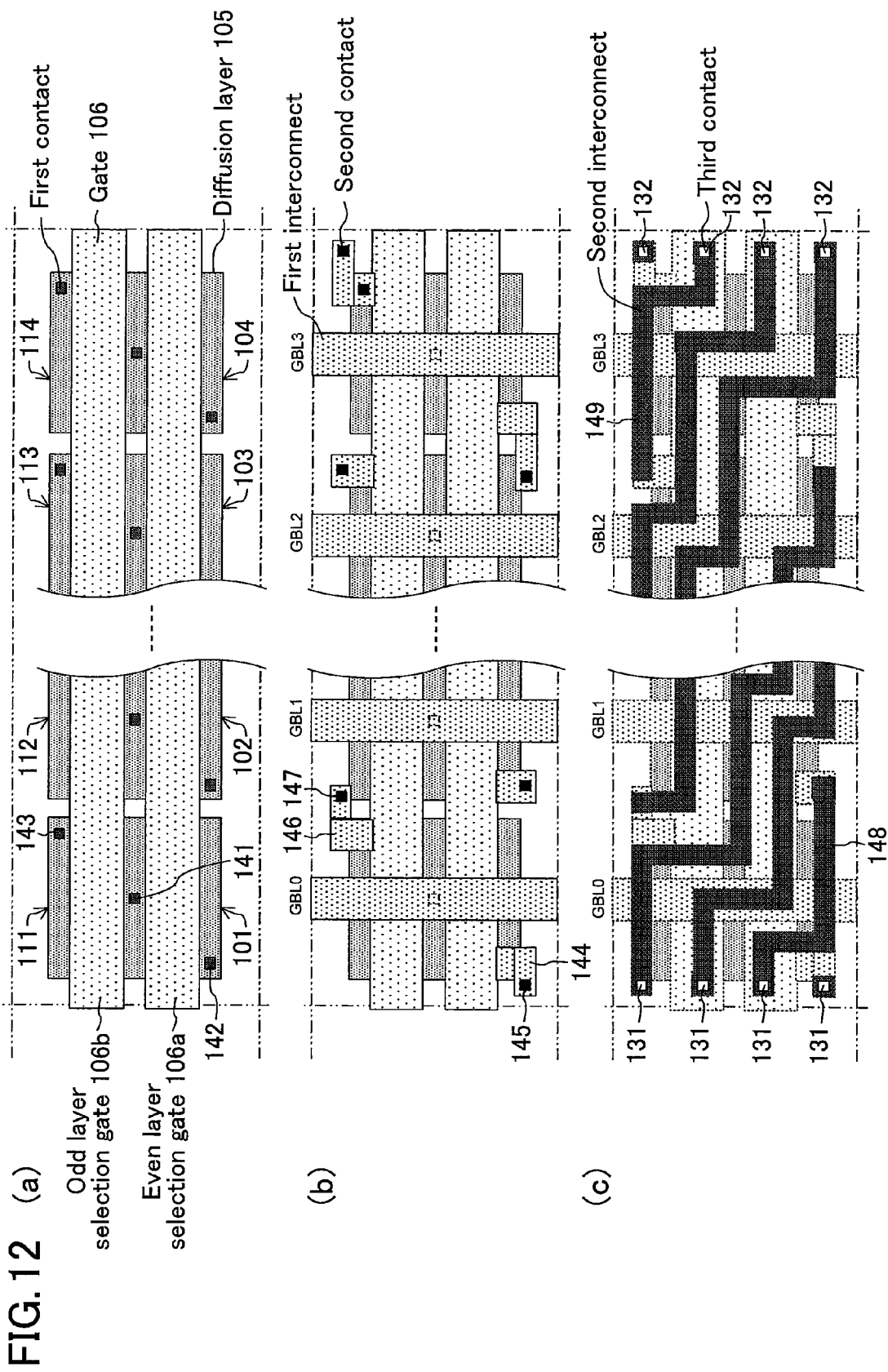
FIG. 12 shows plan views as viewed from top of individual layers constituting the physical structure of the memory cell array.
Figure 13:
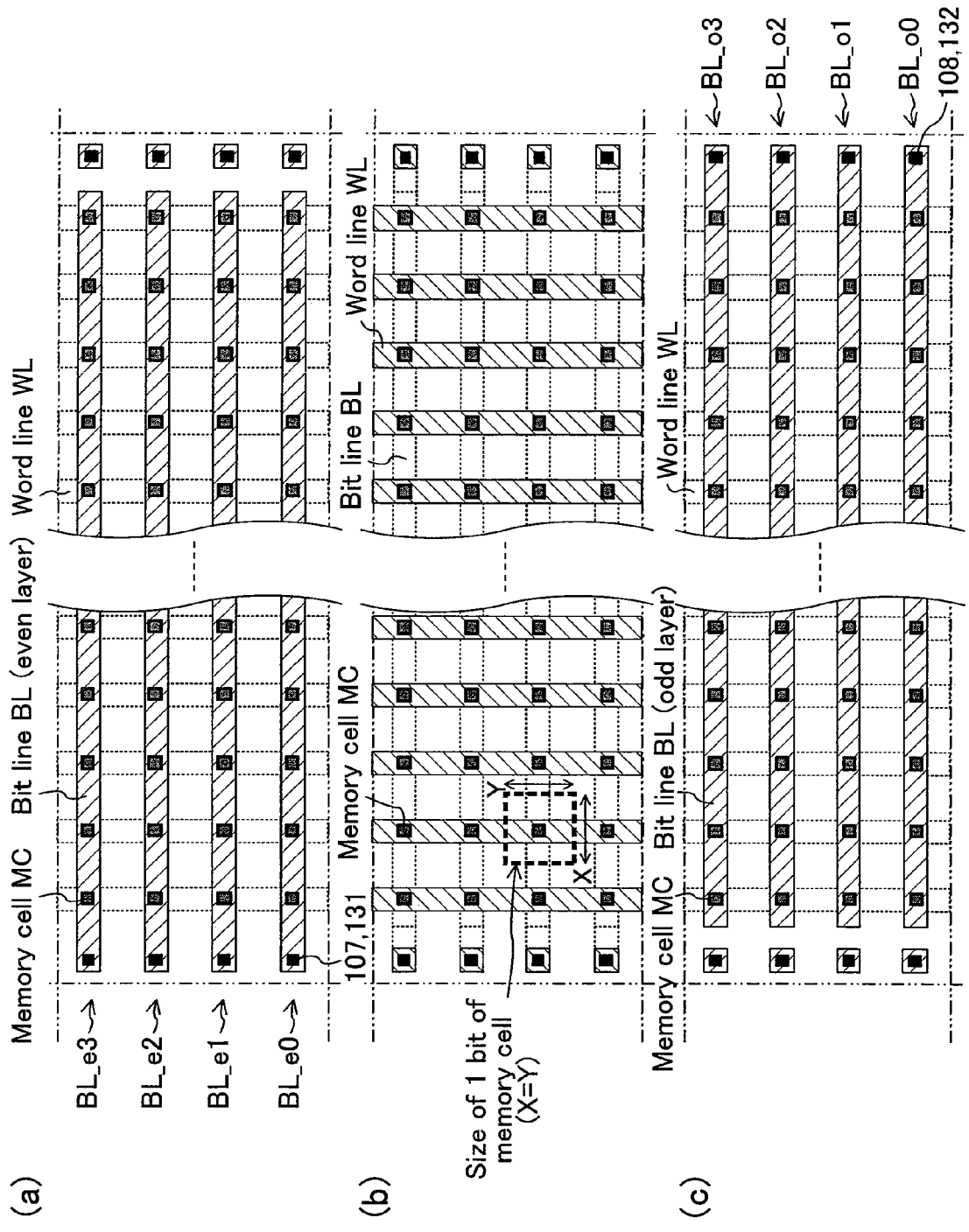
FIG. 13 shows plan views as viewed from top of individual layers constituting the physical structure of the memory cell array.

FIGS. 12 and 13 are plan views as viewed from top of the individual layers constituting the physical structure of FIG. 11. Referring to FIGS. 12 and 13, the physical structure of the memory cell array in this embodiment will be described in further detail.

FIG. 12(a) is a view showing the state in which the diffusion layers and the gates constituting the first and second selection switch elements and the first contacts are formed. As shown in FIG. 12(a), each of the first selection switch elements 101 to 104 and the second selection switch elements 111 to 114 shown in FIG. 5 is composed of a MOSFET made of diffusion layers 105 and a gate 106. Also, the MOSFETs constituting the first and second selection switch elements 101 and 111 for the basic array plane 0 share one of the diffusion regions that are to be the source or the drain, constituting a MOSFET pair. Likewise, the first and second selection switch elements 102 and 112 for the basic array plane 1, the first and second selection switch elements 103 and 113 for the basic array plane 2 and the first and second selection switch elements 104 and 114 for the basic array plane 3 each share a diffusion region and constitutes a MOSFET pair.

The four MOSFET pairs are positioned so that the gate length direction corresponds with the Y direction and arranged side by side in the X direction. The number of MOSFET pairs corresponds with the number of basic array planes: for n basic array planes (n is an integer equal to or more than 2), n MOSFET pairs are placed.

In the four MOSFET pairs, the gates of the MOSFETs constituting the first selection switch elements 101 to 104 are connected with one another, and the gates of the MOSFETs constituting the second selection switch elements 111 to 114 are connected with one another, respectively constituting an even layer selection gate 106a and an odd layer selection gate 106b. The even layer selection signal BLs_e0 is given to the even layer selection gate 106a, and the odd layer selection signal BLs_o0 is given to the odd layer selection gate 106b.

First contacts (contact 141, etc.) for connection with the global bit lines GBL0 to GBL3 are formed on the diffusion regions shared by the respective MOSFET pairs. Also, first contacts (contact 142, etc.) for connection with the common-connected even layer bit lines BL_e0 to BL_e3 are formed on the other diffusion regions of the first selection switch elements 101 to 104, and first contacts (contact 143, etc.) for connection with the common-connected odd layer bit lines BL_o0 to BL_o3 are formed on the other diffusion regions of the second selection switch elements 111 to 114.

FIG. 12(b) is a view showing the state in which the first interconnects including the global bit lines and the second contacts are formed on the structure of FIG. 12(a). As shown in FIG. 12(b), the global bit lines GBL0 to GBL3 extend in the Y direction and are connected with the diffusion regions shared by the respective MOSFET pairs via the first contacts (contact 141, etc.). Also placed are interconnects (interconnect 144, etc.) connected with the other diffusion regions of the first selection switch elements 101 to 104 via the first contacts. Second contacts (contact 145, etc.) are formed on these interconnects for connection with the common-connected even layer bit lines BL_e0 to BL_e3. Likewise, interconnects (interconnect 146, etc.) are placed which are connected with the other diffusion regions of the second selection switch elements 111 to 114 via the first contacts. Second contacts (contact 147, etc.) are formed on these interconnects for connection with the common-connected odd layer bit lines BL_o0 to BL_o3.

FIG. 12(c) is a view showing the state in which the second interconnects and the third contacts are formed on the structure of FIG. 12(b). The second interconnects are formed in a wiring layer placed between the global bit lines GBL and the memory cell array. As shown in FIG. 12(c), four contacts 131 are arranged side by side in the Y direction at the left end as viewed from the figure, and four contacts 132 are arranged side by side in the Y direction at the right end as viewed from the figure. In other words, the contact regions for the common-connected even layer bit lines BL_e0 to BL_e3 in the basic array planes 0 to 3 are arranged side by side in the Y direction, and the contact regions for the common-connected odd layer bit lines BL_o0 to BL_o3 in the basic array planes 0 to 3 are arranged side by side in the Y direction. Also, as is found from the cross section of FIG. 11(b), the contact vias for the bit lines BL connected in common extend from the contact regions of this wiring layer in the direction normal to the substrate 3.

Interconnects (interconnect 148, etc.) are respectively provided so as to connect the contacts 131 with the second contacts (contact 145, etc.) connected with the other diffusion regions of the first selection switch elements 101 to 104. Likewise, interconnects (interconnect 149, etc.) are respectively provided so as to connect the contacts 132 with the second contacts (contact 147, etc.) connected with the other diffusion regions of the second selection switch elements 111 to 114. Hence, the contacts 131 are connected with the non-shared diffusion regions of the first selection switch elements 101 to 104, and the contacts 132 are connected with the non-shared diffusion regions of the second selection switch elements 111 to 114.

As described above, by placing a wiring layer between the global bit lines and the memory cell array to interpose interconnects formed in the wiring layer therebetween for electrical connection between the common-connected bit lines and the selection switch elements, the selection switch elements can be placed without being restricted by the placement of the bit line contact regions. Hence, placement and size configuration with a high degree of freedom is permitted.

FIG. 13(a) is a view showing bit lines in an even layer formed above the structure of FIG. 12(c). As shown in FIG. 13(a), the bit lines BL in even layers are connected in common via the contacts 107 placed between the word line layers and the bit line layers (BL_e0 to BL_e3), and are further connected with the contacts 131 shown in FIG. 12(c). Note that although the memory cells MC are shown as being rectangular in FIG. 13(a) and other plan views, they will be circular in actual finished size.

FIG. 13(b) is a view showing word lines formed above the structure of FIG. 12(c). In FIG. 13(b), the size (pitch) of one bit of memory cell MC is shown as the broken-line rectangle, in which the pitch in the X direction (bit line direction) and the pitch in the Y direction (word line direction) are equal to each other.

FIG. 13(c) is a view showing bit lines in an odd layer formed above the structure of FIG. 12(c). As shown in FIG. 13(c), the bit lines BL in odd layers are connected in common via the contacts 108 placed between the word line layers and the bit line layers (BL_o0 to BL_o3), and are further connected with the contacts 132 shown in FIG. 12(c).

It should be noted that when the physical structure described above is adopted, the layout area increases by the regions for providing the contacts 107 and 131 for connecting the bit lines in even layers with one another and the regions for providing the contacts 108 and 132 for connecting the bit lines in odd layers with one another. Assume herein that the memory cell pitch in the X direction and the via pitch (length of the contact regions) are both 0.48 μm. In this case, when the number of memory cells in the X direction is 32, for example, the proportion of the contact regions in the entire area is $$(0.48 \times 2)/(0.48 \times 32 + 0.48 \times 2) = 5.9\%$$

That is, the layout area does not increase so largely as long as the number of memory cells in the X direction is sufficiently large.

Figure 14:
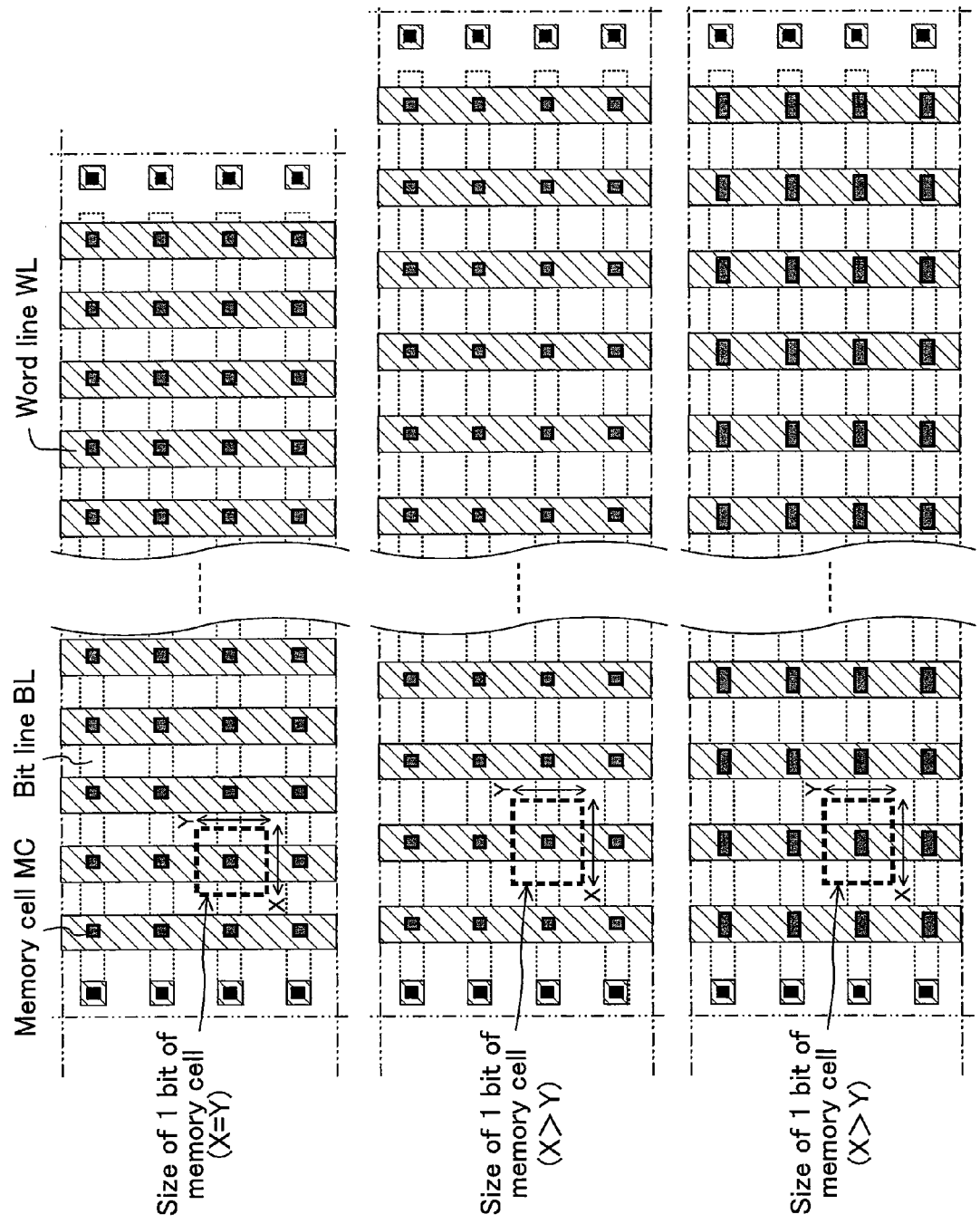
FIG. 14 shows alterations of the physical structure of the surroundings of memory cells.

FIG. 14 shows alterations of the physical structure of the surroundings of the memory cells, in which some change has been made for the plan view of FIG. 13(b).

In the alteration shown in FIG. 14(a), the word lines WL are wider than those in FIG. 13(b), and this makes the word lines WL wider than the bit lines BL. Alternatively, the bit lines BL may be made narrower than those in FIG. 13(b). Note however that since the pitches of the word lines WL and the bit lines BL are left unchanged from those in FIG. 13(b), the sizes X and Y of the memory cells MC remain the same.

The reason why the word lines are widened is for reducing the resistance value of the word lines that are longer than the bit lines, so that the potential drop during write and read can be minimized. The bit lines, which are short compared with the word lines, are less likely to cause a potential drop. Therefore, the bit lines can be made thinner to widen the space therebetween as much as possible, so that reduction in yield due to a short-circuit failure caused by particles during fabrication can be prevented.

As a means for implementing the configuration of FIG. 14(a), the mask size for the word lines may be made different from that for the bit lines. As another method, the lithography conditions may be individually optimized in a word line formation step and a bit line formation step in the fabrication process. Examples of optimization of the lithography conditions include adjustment of the length of the exposure time, adoption of an exposure apparatus with higher sensitivity in the word line formation step and the like.

In the alteration shown in FIG. 14(b), the word lines WL is wider than the bit lines BL as in FIG. 14(a). In addition to this, the pitch of the word lines WL is large. Hence, the size of the memory cells MC is oblong with the pitch in the X direction being longer than the pitch in the Y direction. The reason and the implementation means for the configuration of FIG. 14(b) are substantially the same as those for the configuration of FIG. 14(a).

In the alteration shown in FIG. 14(c), the shape of the memory cells MC themselves is oblong in addition to the configuration of FIG. 14(b). That is, the shape of the memory cells MC is rectangular with the size in the X direction being larger than the size in the Y direction. Note however that the actual finished shape will be oval. By increasing the area of each memory cell in this way, the read current (in particular, the read current observed when the variable resistance element is in the low resistance state) can be increased, and this ensures a large read operation margin.

Figure 15:
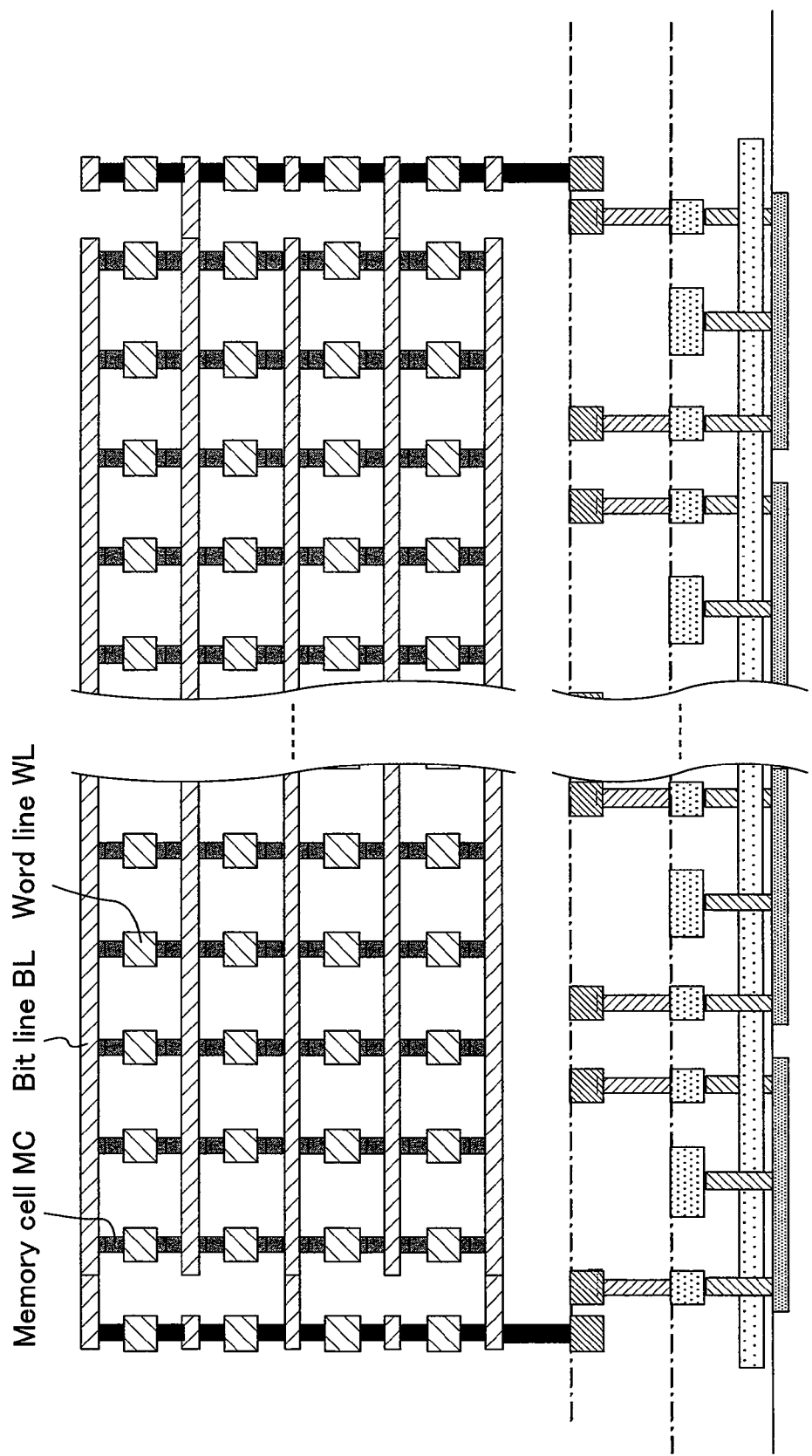
FIG. 15 shows an alteration of the physical structure of the surroundings of memory cells.

FIG. 15 is a view showing an alteration of the physical structure of the surroundings of the memory cells, in which some change has been made for the cross section of FIG. 11(b). In the alteration shown in FIG. 15, the bit lines BL are thin compared with the word lines WL. This alteration is based on the point described above that the resistance of the bit lines can be made high compared with that of the word lines. With this change, the height of the entire memory cell array can be held low. In particular, since the flatness can be easily secured for a multilayer configuration, microfabrication such as a lithography step is facilitated. Also, the parasitic capacitance of the bit lines can be reduced.

As a means for implementing the configuration of FIG. 15, other than simply thinning the bit line layers compared with the word line layers, considered, for example, is using a material different from the material of the word lines for the bit lines. For example, while the word lines are formed of aluminum, copper and the like, the bit lines may be formed of a thin-film conductive material such as Ta and TaN. Note that the alterations shown in FIGS. 14 and 15 may be applied, not only to memory cells of the cross point structure adopting the multilayer hierarchical bit lines in this embodiment, but also to single-layer structured hierarchical bit lines and normal cross point memory cells. In such cases, also, substantially the same effect can be expected.

In the physical structure of the memory cell array in this embodiment, the MOSFETs that are to be the first and second selection switch elements are formed below the bit lines and the word lines. In this relation, it is preferred that the region of the MOSFETs does not protrude from the region in which the bit lines and the word lines intersect with each other forming the memory cells as viewed in the Z direction (as viewed in the XY plane). In other words, the area of the memory cell array should not be increased by the existence of the first and second selection switch elements for implementing the hierarchical bit line scheme. Moreover, it is preferred that the layout of such MOSFETs is implemented without increasing the pitch of the memory cells (wiring pitch). The method for implementing the above will be described with reference to FIG. 16.

As shown in FIG. 16(*a*), as a precondition, an even layer selection transistor constituting a first selection switch element and an odd layer selection transistor constituting a second selection switch element are paired and share either one of the source/drain (corresponding to the MOSFET pairs shown in FIG. 12(*a*)). Assume that the size of the paired transistors in the Y direction is Ytr, which is determined based on the design rules, the transistor breakdown voltage specifications and the like. Assume also that the wiring pitch of the bit lines BL (Y-direction pitch of the memory cells) is Ym, where Ym=L (wiring width)+S (wiring space), and that the wiring pitch of the word lines WL is Xk.

It is herein assumed that when Ytr≦4×Ym is satisfied, four bit lines are placed. In other words, four basic array planes are placed. In this case, four odd layer selection transistors and four even layer selection transistors are necessary. Assume that the size of four pairs of odd layer selection transistors and even layer selection transistors arranged side by side in the X direction is Xtr, which is determined based on the design rules, the transistor current specifications and the like. The number of word lines is then determined so that Xm>Xtr is satisfied where Xm is the size of the range occupied by the word lines in the X direction. In the physical structure of FIG. 11, the number of word lines as viewed in the XY plane is 32.

FIG. 16(*b*) shows the case that 4×Ym<Ytr≦8×Ym is satisfied. In the example of FIG. 16(*b*), eight bit lines are placed and eight basic array planes are placed. Eight pairs of odd layer selection transistors and even layer selection transistors are arranged side by side in the X direction, and the number of word lines is determined so that Xm is greater than the size Xtr of the eight pairs.

As a case other than the cases of FIG. 16, when Ytr≦6×Ym is satisfied, for example, six bit lines may be placed to place six basic array planes, and six pairs of odd layer selection transistors and even layer selection transistors may be arranged side by side in the X direction. When 8×Ym<Ytr≦16×Ym is satisfied, 16 bit lines may be placed to place 16 basic array planes, and 16 pairs of odd layer selection transistors and even layer selection transistors may be arranged side by side in the X direction, based on the concept described above.

In general, $$Ytr \leq n \times Ym \text{ and } Xtr \leq Xm = k \times Xk$$

are preferably satisfied where n is the number of bit lines (corresponding to the number of basic array planes) and k is the number of word lines as viewed in the XY plane. With this, the region of the transistors constituting the first and second selection switch elements will not protrude from the region in which the memory cells are placed. Hence, the first and second selection switch elements for implementing the hierarchical bit line scheme can be placed without increasing the layout area of the memory cell array.

When considering the structure of multilayer hierarchical bit lines, the present inventors have paid attention to the following points.

First, the present inventors have considered that the structure of placing memory cells on both the top and bottom sides (in the Z direction) of word lines or bit lines will be desirable from the standpoint of reduction of the fabrication process steps. In other words, placing memory cells at all intersections of word lines and bit lines stacked one upon another alternately has a merit that the number of word lines and bit lines can be minimized with respect to the number of memory cells in the Z direction. In this multilayer structure, however, if bit lines in all layers are connected in common, two memory cells will be selected for selection of one word line.

According to the present invention, the bit lines are grouped into even layers and odd layers and the two groups are individually connected in common, so that one memory cell can be selected for selection of one word line. Selection switch elements are respectively provided for the even layers and the odd layers to allow selection of either the even layers or the odd layers. In other words, a configuration like that shown on the left of FIG. 6 is adopted as the configuration of a basic array plane. Also, the XY shape of the layout of a plurality of basic array planes put together, including the selection switch elements placed below the basic array planes, is rectangular. By simply arranging such rectangles, a memory can be easily configured.

Second, the placement of the selection switch elements for the even layers and the odd layers was examined. More specifically, two selection switch elements are necessary for one basic array plane. The layout size of the memory cell array should desirably be determined, not with the placement size of the selection switch elements, but with the placement size of the basic array planes themselves. Hence, it is very effective to adopt a method in which a plurality of basic array planes are placed in the Y direction and all of a plurality of selection switch elements for these basic array planes are placed to fit within the region under the basic array planes.

Third, the layout of the plurality of selection switch elements for the plurality of basic array planes when they are all placed within the region under the basic array planes was examined.

In the configuration shown in FIG. 5, considered is placing the first selection switch elements 101 to 104 and the second selection switch elements 111 to 114 under the related plurality of basic array planes 0 to 3 and yet implementing connection between the selection switch elements and the bit lines with a reduced number of wiring layers involved. As is found from FIG. 8, the even/odd layer selection signals in the X direction are shared by blocks 100 lined in the X direction, each of which is composed of a plurality of basic array planes (four in FIG. 5) put together. The even/odd layer selection signals are connected to the gates of the selection switch elements. Hence, it is found effective in reducing the number of wiring layers to adopt such a configuration that polysilicon interconnects constituting the gates are placed in the X direction to allow the gates of transistors inside/outside the blocks to be connected with one another with only the polysilicon interconnects.

According to the idea described above, as shown in FIG. 12(*a*), the MOSFETs constituting the first selection switch elements 101 to 104 are placed with their gate width being in the X direction, so that the polysilicon gates are aligned and connected with one another, forming the even layer selection gate 106*a*. Likewise, the MOSFETs constituting the second selection switch elements 111 to 114 are placed with their gate width being in the X direction, so that the polysilicon gates are aligned and connected with one another, forming the odd layer selection gate 106*b*. Each of the MOSFETs constituting the first selection switch elements 101 to 104 and each of the MOSFETs constituting the second selection switch elements 111 to 114 constitute a MOSFET pair whose gate length is in the Y direction and which share one diffusion region.

In the layout configuration described above, the gate width direction of the MOSFETs constituting the selection switch elements is the same as the direction of the bit lines. Hence, by increasing the number of bits on the same bit line in a basic array plane, the gate width of the selection switch elements can be increased without the fear of the selection switch elements protruding from the region of the memory cell array. In other words, the degree of freedom of the gate width of the selection switch elements is high.

As described above with reference to FIG. 16, the size Ytr of the paired selection switch elements in the Y direction (gate length direction) is determined based on the design rules and breakdown voltage specifications of the MOSFETs constituting the selection switch elements. In other words, the selection switch elements can be kept from protruding the region of the memory cell array in the Y direction by adjusting the number of basic array planes so that the size of the memory cell array in the Y direction is equal to or more than Ytr.

As described above, the size of the selection switch elements under the memory cell array in the X direction (gate width direction) can be set freely, and also the size thereof in the Y direction (gate length direction) has some degree of freedom. Hence, this configuration is adaptive to changes in the type and gate width of the transistors of the selection switch elements, permitting flexible response to any kind of process, and yet ensures attainment of transistor performance required as the selection switch elements.

Next, the effect of the memory array configuration according to the present invention will be described paying special attention to the direction of the global bit lines.

One feature of the exemplary configuration of the memory array according to the present invention is that the direction of the global bit lines GBL is orthogonal to the direction of the bit lines BL (is the same as the direction of the word lines WL). The reason for this is that consideration has been made to ensure that no concentration of a current into a global bit line GBL or a word line WL occurs when a plurality of memory cells are simultaneously selected.

To state more specifically, in the configuration of FIG. 8, in 16-bit access (one bit for each block), when one bit line selection signal (discriminating between even/odd layer selection signals) is selected, 16 blocks of blocks 0 to 15 related to this bit line selection signal are selected. In each block, one memory cell is selected from one selected word line and one selected global bit line. Hence, a total of 16 bits, one for each block, are accessed with the independent word lines and global bit lines.

The memory cell according to the present invention, which is made of a variable resistance element, allows continuous flow of a current during being accessed. Especially, during erase and write, a large amount of current flows due to its nature. According to the configuration of the present invention, only one selected memory cell exists on a current path from the global bit line decoder/driver 202 to the word line decoder/driver 201. Hence, the ability of the driver for driving the selected line may be designed considering only one memory cell. Also, the effect of minimizing the voltage drop of interconnects can be obtained. Although 16 blocks are placed in the Y direction assuming 16-bit simultaneous access in FIG. 8, the number of blocks may be increased in the configuration of the present invention, like placing 32 blocks in the Y direction for 32-bit simultaneous access or placing 64 blocks in the Y direction for 64-bit simultaneous access, for example. In this way, the number of simultaneously accessed bits can be easily increased without impairing the characteristics of the bits.

If the global bit lines extend in the same direction as the bit lines, the current flowing in one selected bit line will increase in proportion to the number of simultaneously accessed bits. This will cause such problems that the ability of the bit line driver is insufficient, and that the voltage at the memory cell greatly differs between a bit close to the bit line driver and a bit apart from the bit line driver resulting in a great difference in memory cell characteristics. The effect of such problems is particularly great during write.

Accordingly, the configuration of the present invention has the effect that multi-bit simultaneous access is facilitated and invariably stable memory cell characteristics are obtained because each selection driver is responsible for only one-bit memory cell.

Also, in the layout of the selection switch elements, connection is facilitated by placing the global bit lines GBL in the direction orthogonal to the direction of the bit lines BL. In other words, as shown in FIG. 12(*b*), the bit line selection signal lines are formed in the X direction as the gate interconnects, and the global bit lines GBL are formed in a layer above the selection switch elements in the Y direction and connected with the diffusion layers via the contacts 141. Hence, the wiring connection can be easily achieved.

Figure 17:
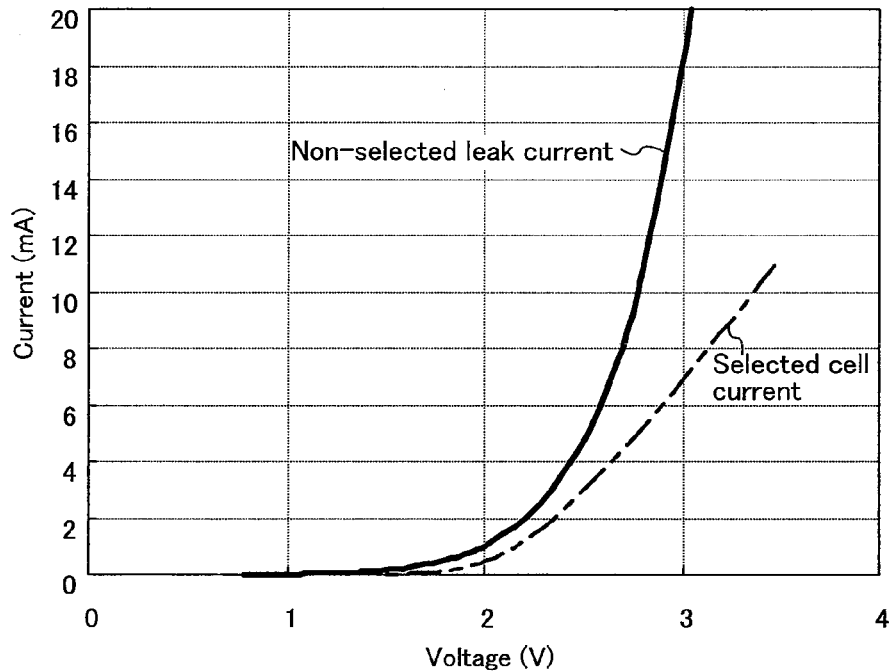
FIG. 17 is a graph showing the current-voltage characteristic of a large memory array.
Figure 18:
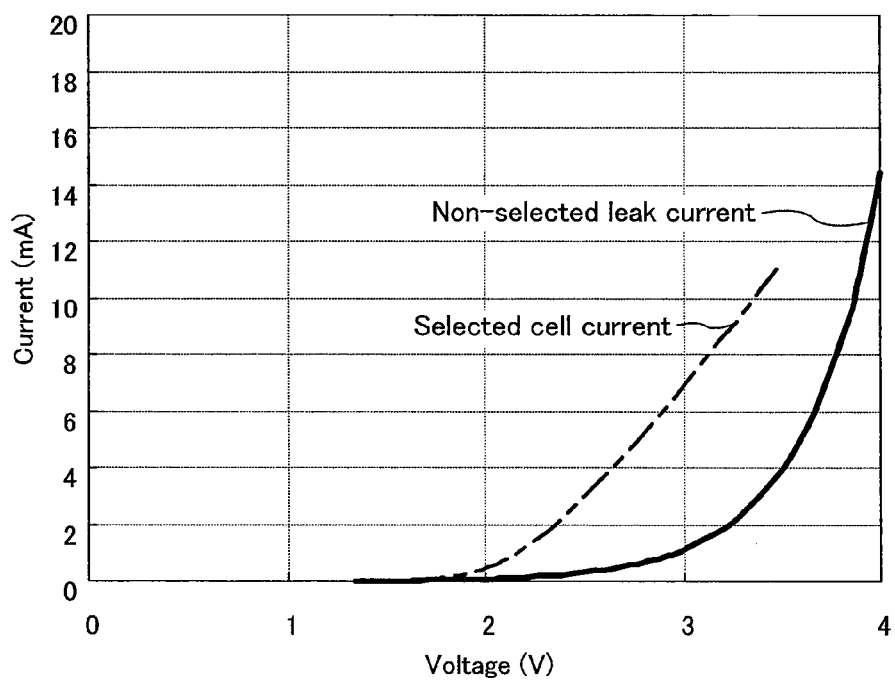
FIG. 18 is a graph showing the current-voltage characteristic of a memory array adopting the configuration of the embodiment of the present invention.

FIGS. 17 and 18 are graphs showing the effect of this embodiment, which demonstrate that the leak current of the bit lines is reduced in this embodiment. FIG. 17 shows the current-voltage characteristic of a large memory array (4 k×4 k bits) that does not adopt the configuration of the present invention, and FIG. 18 shows the current-voltage characteristic of a small memory array (32×4 k bits) that adopts the configuration of the present invention. In FIGS. 17 and 18, the current value flowing from a selected memory cell is shown by the broken line.

As shown in FIG. 17, in a large memory array, the leak current from non-selected memory cells exceeds the current of the selected memory cell. In contrast to this, as shown in FIG. 18, when the array size is reduced according to the configuration of this embodiment, the leak current from non-selected memory cells markedly decreases. Hence the current of the selected memory cell can be detected without fail.

INDUSTRIAL APPLICABILITY

As described above, according to the present invention, a resistance change nonvolatile memory device having a multi-segmented memory cell array can be implemented with a small layout area. Hence, the present invention is useful in implementing a high-integration, small-area memory, for example.

The invention claimed is:

1. A resistance change nonvolatile memory device comprising memory cells each having a variable resistance element whose resistance value reversibly changes according to an electrical signal, the memory device comprising:
   a substrate; and
   a memory cell array formed on the substrate, the memory cell array including the plurality of memory cells arranged in an array, wherein:

in the memory cell array, the memory cells are formed at intersections of bit lines formed in a plurality of layers to extend in X direction and word lines formed in layers between the bit lines to extend in Y direction perpendicular to the X direction so as to be sandwiched between the bit lines and the word lines, a plurality of basic array planes sharing the word lines, each formed for each group of bit lines aligned in Z direction, perpendicular to the X and Y directions, in which layers are stacked, are arranged side by side in the Y direction, in each of the basic array planes, bit lines in even layers are connected in common, and bit lines in odd layers are connected in common, and the resistance change nonvolatile memory device further comprises:

global bit lines; and first and second selection switch elements provided for each basic array plane, the first selection switch element controls switching of electrical connection/non-connection between the global bit line for the relevant basic array plane and common-connected even layer bit lines in the relevant basic array plane according to an even layer selection signal, and the second selection switch element controls switching of electrical connection/non-connection between the global bit line for the relevant basic array plane and common-connected odd layer bit lines in the relevant basic array plane according to an odd layer selection signal.

2. The resistance change nonvolatile memory device of claim 1, wherein each of the first and second selection switch elements is composed of a MOSFET formed in the substrate.

3. The resistance change nonvolatile memory device of claim 2, wherein a MOSFET constituting the first selection switch element and a MOSFET constituting the second selection switch element constitute a MOSFET pair sharing one of diffusion regions that are to be a source or a drain, and the shared diffusion region is connected with the global bit line.

4. The resistance change nonvolatile memory device of claim 3, wherein assuming that the number of basic array planes is n, n being an integer equal to or more than 2, the MOSFET pair is placed so that the gate length direction corresponds with the Y direction, and n such MOSFET pairs are arranged side by side in the X direction, and gates of MOSFETs constituting the first selection switch elements are connected with each other, and gates of MOSFETs constituting the second selection switch elements are connected with each other.

5. The resistance change nonvolatile memory device of claim 4, wherein $$Ytr \leq n \times Ym \text{ and } Xtr \leq k \times Xk$$

are satisfied where, as viewed in XY plane formed of the X direction and the Y direction, Ytr is the size of the MOSFET pair in the gate length direction, Xtr is the size of n MOSFET pairs arranged side by side in the X direction, Ym is the wiring pitch of the bit lines, k is the number of word lines, and Xk is the wiring pitch of the word lines.

6. The resistance change nonvolatile memory device of claim 4, wherein in each of the MOSFET pairs, the non-shared diffusion region of the MOSFET constituting the first selection switch element is electrically connected with the common-connected even layer bit lines in the relevant basic array plane, and the non-shared diffusion region of the MOSFET constituting the second selection switch element is electrically connected with the common-connected odd layer bit lines in the relevant basic array plane.

7. The resistance change nonvolatile memory device of claim 6, wherein a wiring layer is provided between the global bit lines and the memory cell array, in the wiring layer, contact regions for the common-connected even layer bit lines in the basic array planes are arranged side by side in the Y direction, and contact regions for the common-connected odd layer bit lines in the basic array planes are arranged side by side in the Y direction, and interconnects for connecting the non-shared diffusion regions of the MOSFETs constituting the first selection switch elements in the MOSFET pairs with the contacts for the common-connected even layer bit lines in the relevant basic array planes and interconnects for connecting the non-shared diffusion regions of the MOSFETs constituting the second selection switch elements in the MOSFET pairs with the contacts for the common-connected odd layer bit lines in the relevant basic array planes are formed in the wiring layer.

8. The resistance change nonvolatile memory device of claim 7, wherein contact vias for the common-connected bit lines extend from the contact regions of the wiring layer in the direction normal to the substrate.

9. The resistance change nonvolatile memory device of any of claims 1 to 8, wherein the global bit lines are formed to extend in the Y direction in a layer under the memory cell array.

10. The resistance change nonvolatile memory device of any of claims 1 to 8, wherein the variable resistance element of each memory cell can be in a low resistance state and a high resistance state, and has bidirectionality that the variable resistance element in the low resistance state changes to the high resistance state when an applied voltage exceeds a first voltage and the variable resistance element in the high resistance state changes to the low resistance state when an applied voltage in a direction opposite to the first voltage application direction exceeds a second voltage.

11. The resistance change nonvolatile memory device of any of claims 1 to 8, wherein each of the memory cells has a diode element serially connected with the variable resistance element, the diode element has a nonlinear current characteristic with respect to the applied voltage and has bidirectionality that a current flows bidirectionally depending on the direction of the applied voltage, and assuming that V is the voltage applied to the diode element, I is the current flowing in the diode element, It is a given current for determining the threshold voltage, Vi is a first threshold voltage, and V2 is a second threshold voltage, $V2<0<V1$ and $It>0$ $It \leq I$ in the range satisfying $V1 \leq V$ $I \leq -It$ in the range satisfying $V \leq V2$, and $-It<I<It$ in the region satisfying $V2<V<V1$.

12. The resistance change nonvolatile memory device of claim 9, wherein the variable resistance element of each memory cell can be in a low resistance state and a high resistance state, and has bidirectionality that the variable resistance element in the low resistance state changes to the high resistance state when an applied voltage exceeds a first voltage and the variable resistance element in the high resistance state changes to the low resistance state when an applied voltage in a direction opposite to the first voltage application direction exceeds a second voltage.

13. The resistance change nonvolatile memory device of claim 9, wherein each of the memory cells has a diode element serially connected with the variable resistance element, the diode element has a nonlinear current characteristic with respect to the applied voltage and has bidirectionality that a current flows bidirectionally depending on the direction of the applied voltage, and assuming that V is the voltage applied to the diode element, I is the current flowing in the diode element, It is a given current for determining the threshold voltage, Vi is a first threshold voltage, and V2 is a second threshold voltage, $V2<0<V1$ and $It>0$ $It \leq I$ in the range satisfying $V1 \leq V$ $I \leq -It$ in the range satisfying $V \leq V2$, and $-It < I < It$ in the region satisfying $V2 < V < V1$.

14. The resistance change nonvolatile memory device of claim 10, wherein each of the memory cells has a diode element serially connected with the variable resistance element, the diode element has a nonlinear current characteristic with respect to the applied voltage and has bidirectionality that a current flows bidirectionally depending on the direction of the applied voltage, and assuming that V is the voltage applied to the diode element, I is the current flowing in the diode element, It is a given current for determining the threshold voltage, Vi is a first threshold voltage, and V2 is a second threshold voltage, $V2<0<V1$ and $It>0$ $It \leq I$ in the range satisfying $V1 \leq V$ $I \leq -It$ in the range satisfying $V \leq V2$, and $-It < I < It$ in the region satisfying $V2 < V < V1$.

15. The resistance change nonvolatile memory device of claim 1, wherein in each of the basic array planes, all bit lines in even layers are connected in common, and all bit lines in odd layers are connected in common.

* * * * *